(12) United States Patent
O'Brien et al.

(10) Patent No.: US 11,018,222 B1
(45) Date of Patent: May 25, 2021

(54) METALLIZATION IN INTEGRATED CIRCUIT STRUCTURES

(71) Applicant: Intel Corporation, Santa Clara, CA (US)

(72) Inventors: Daniel B. O'Brien, Beaverton, OR (US); Christopher J. Wiegand, Portland, OR (US); Lukas M. Baumgartel, Portland, OR (US); Oleg Golonzka, Beaverton, OR (US); Dan S. Lavric, Portland, OR (US); Daniel B. Bergstrom, Lake Oswego, OR (US); Jeffrey S. Leib, Hillsboro, OR (US); Timothy Michael Duffy, Beaverton, OR (US); Dax M. Crum, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/728,088

(22) Filed: Dec. 27, 2019

(51) Int. Cl.
*H01L 29/06* (2006.01)
*H01L 23/00* (2006.01)
*B82B 1/00* (2006.01)

(52) U.S. Cl.
CPC .......... *H01L 29/0669* (2013.01); *B82B 1/008* (2013.01); *H01L 24/46* (2013.01)

(58) Field of Classification Search
CPC .................................................. H01L 29/0669
See application file for complete search history.

(56) References Cited

U.S. PATENT DOCUMENTS

| 10,319,846 | B1 * | 6/2019 | Ando | H01L 29/401 |
| 2017/0323949 | A1 * | 11/2017 | Loubet | B82Y 10/00 |
| 2018/0240676 | A1 * | 8/2018 | Chan | C23C 16/452 |
| 2019/0165176 | A1 * | 5/2019 | Wang | H01L 29/66545 |
| 2020/0020541 | A1 * | 1/2020 | Chang | H01L 21/28079 |

\* cited by examiner

*Primary Examiner* — Moazzam Hossain
*Assistant Examiner* — Mohammad A Rahman
(74) *Attorney, Agent, or Firm* — Patent Capital Group

(57) ABSTRACT

Disclosed herein are structures, methods, and assemblies related to metallization in integrated circuit (IC) structures. For example, in some embodiments, an IC structure may include a first nanowire in a metal region and a second nanowire in the metal region. A distance between the first nanowire and the second nanowire may be less than 5 nanometers, and the metal region may include tungsten between the first nanowire and the second nanowire.

20 Claims, 34 Drawing Sheets

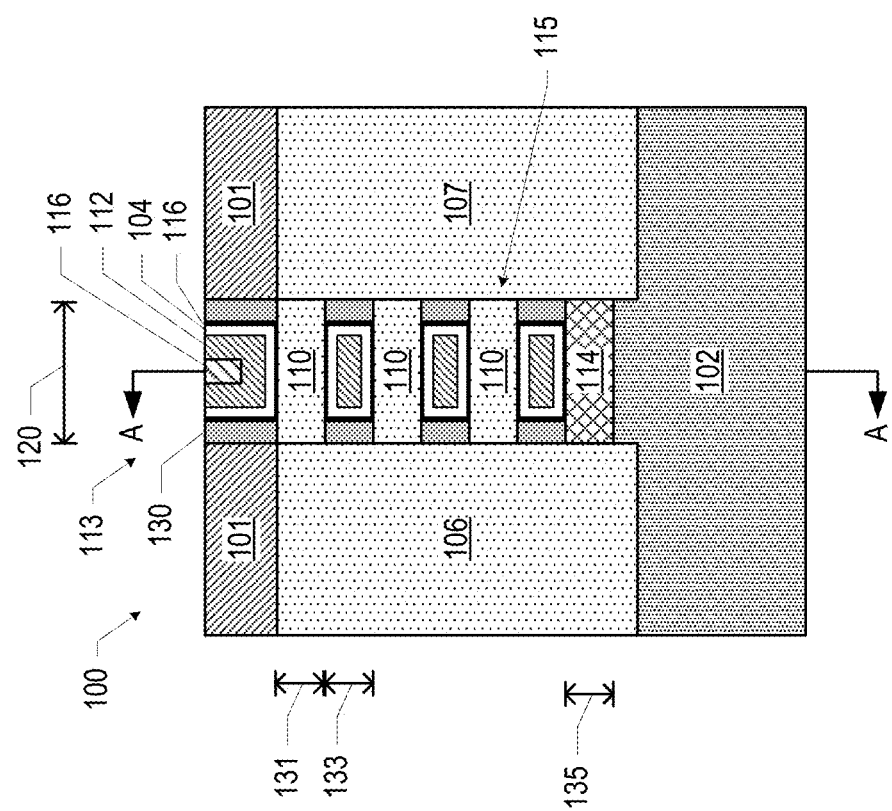

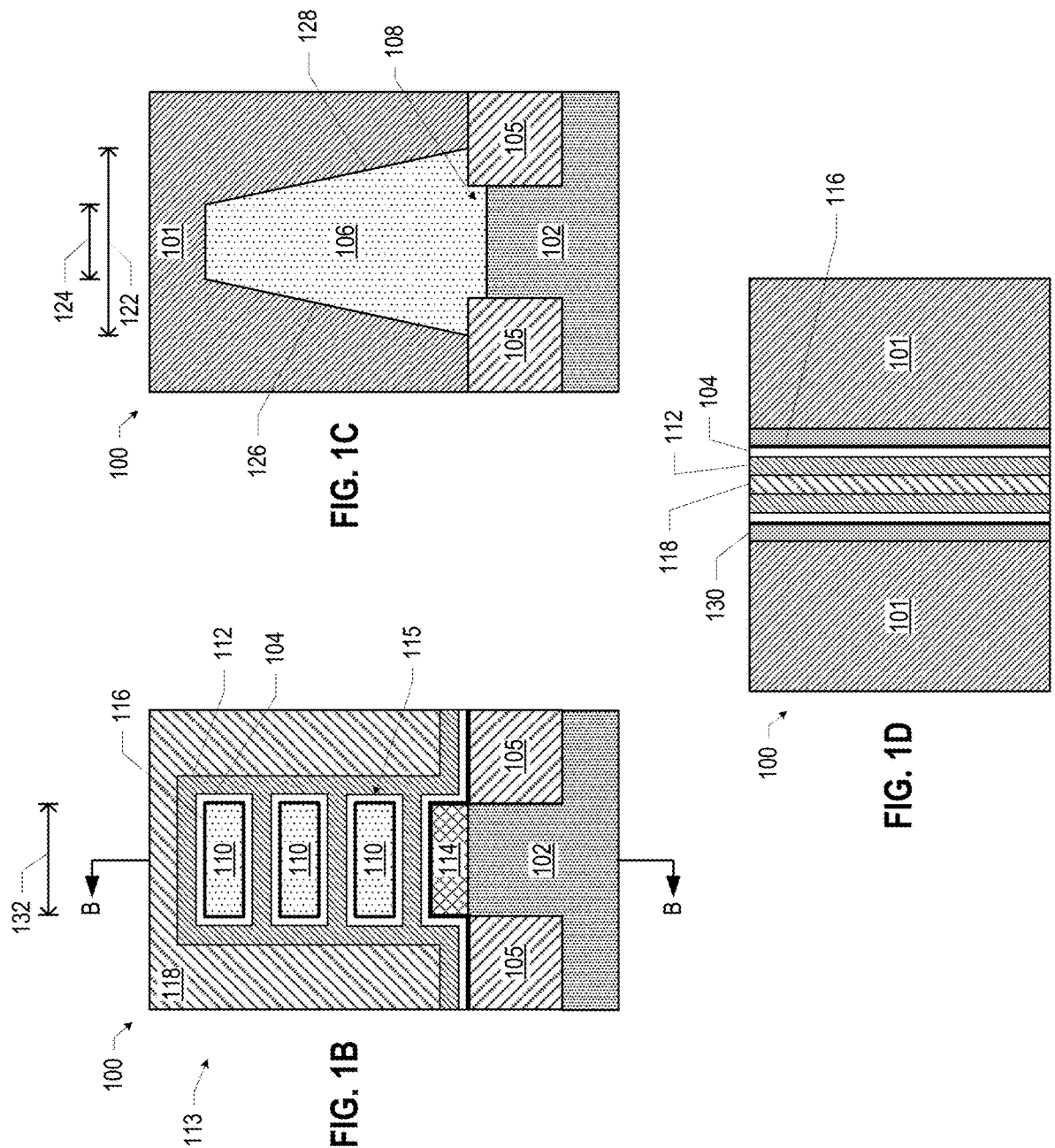

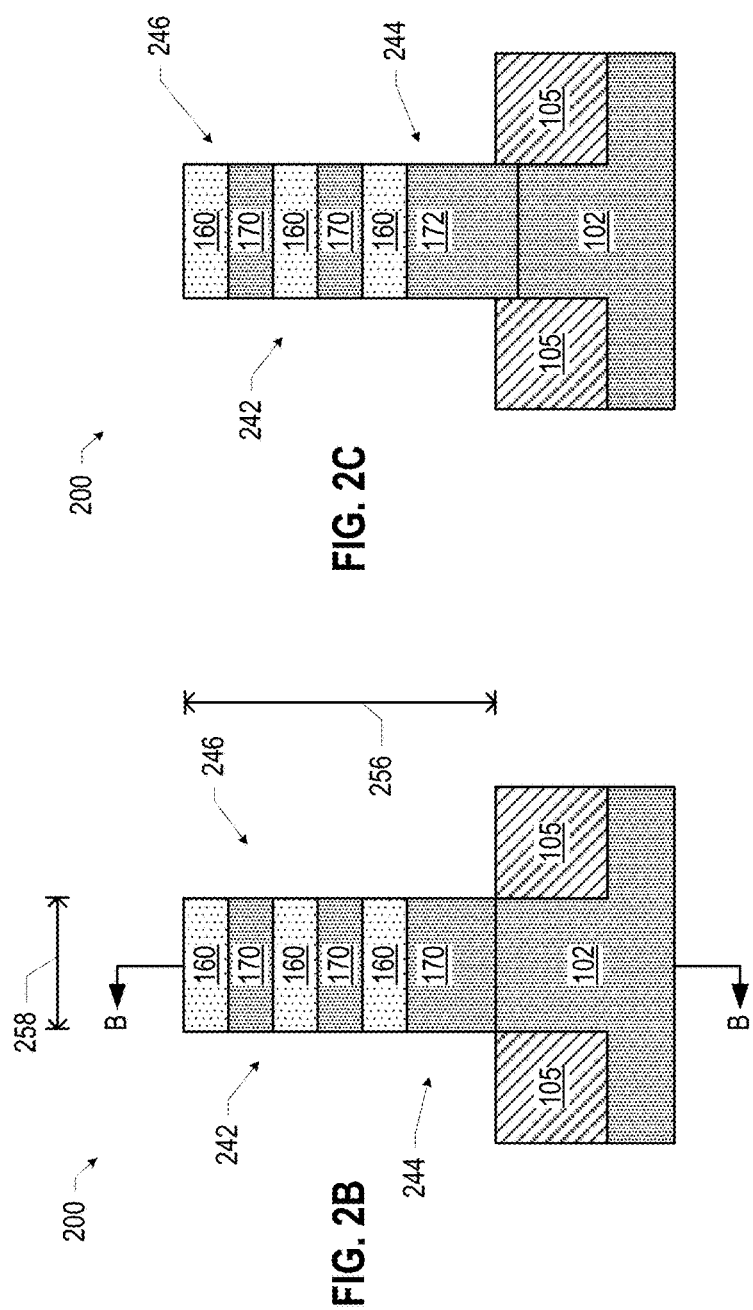
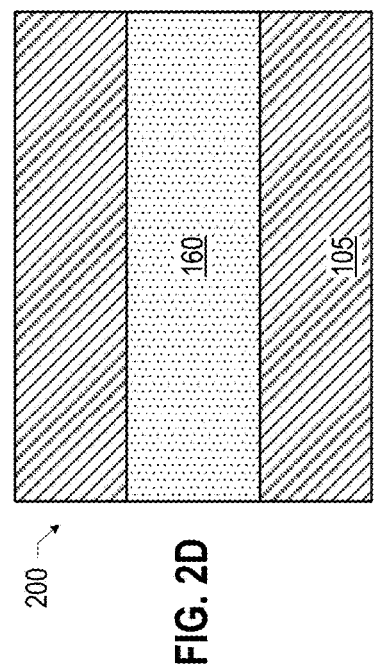
FIG. 2B
FIG. 2C
FIG. 2D

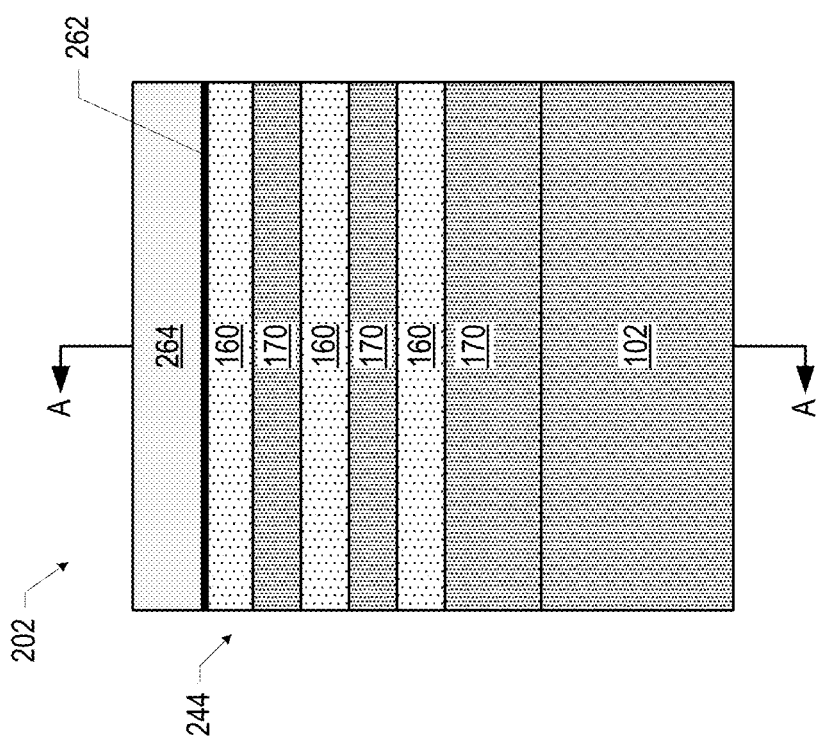

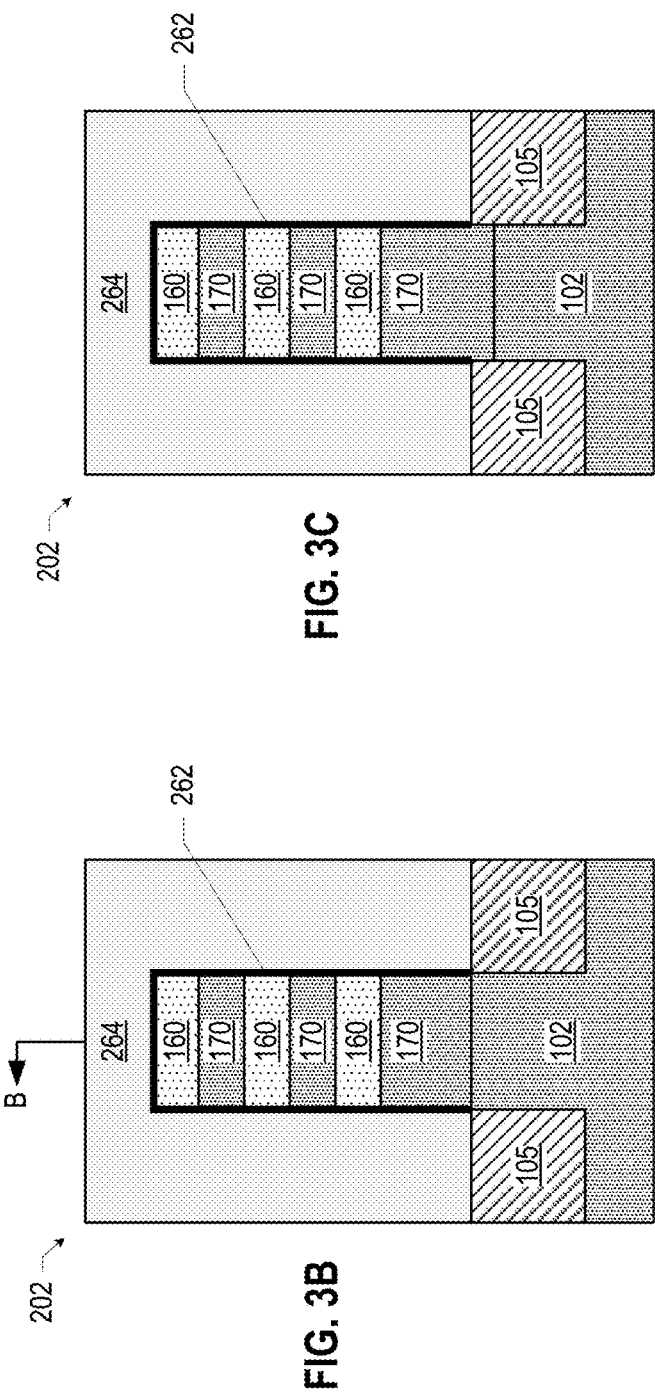
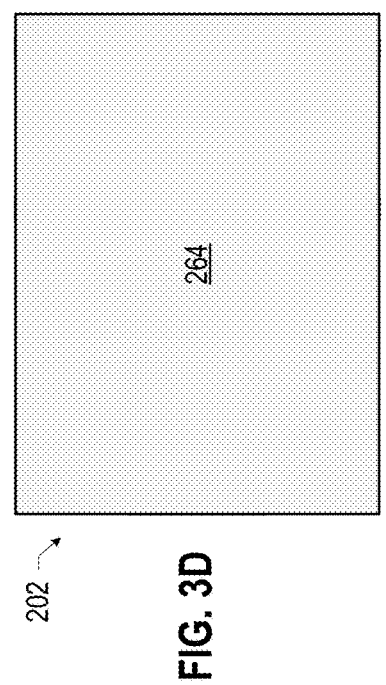
FIG. 3B
FIG. 3C
FIG. 3D

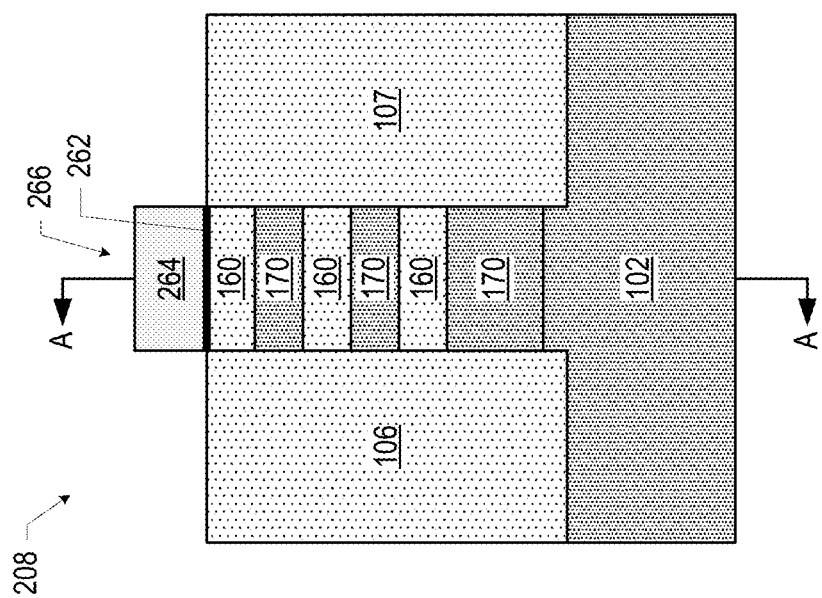

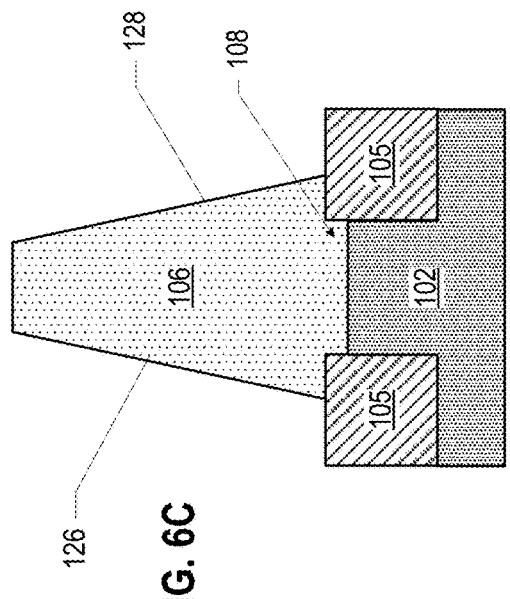
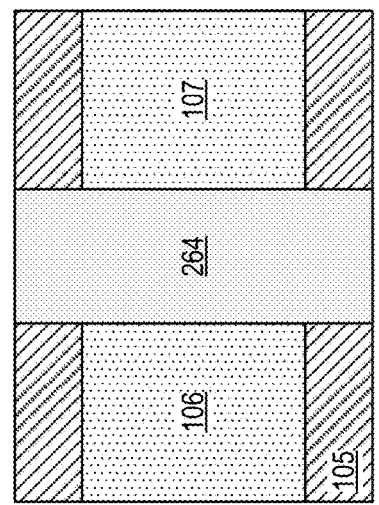
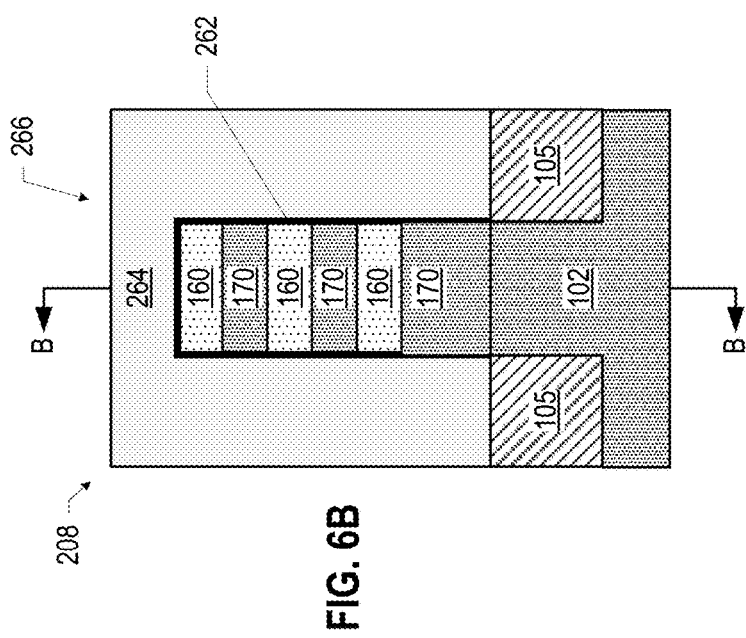
FIG. 6B
FIG. 6C
FIG. 6D

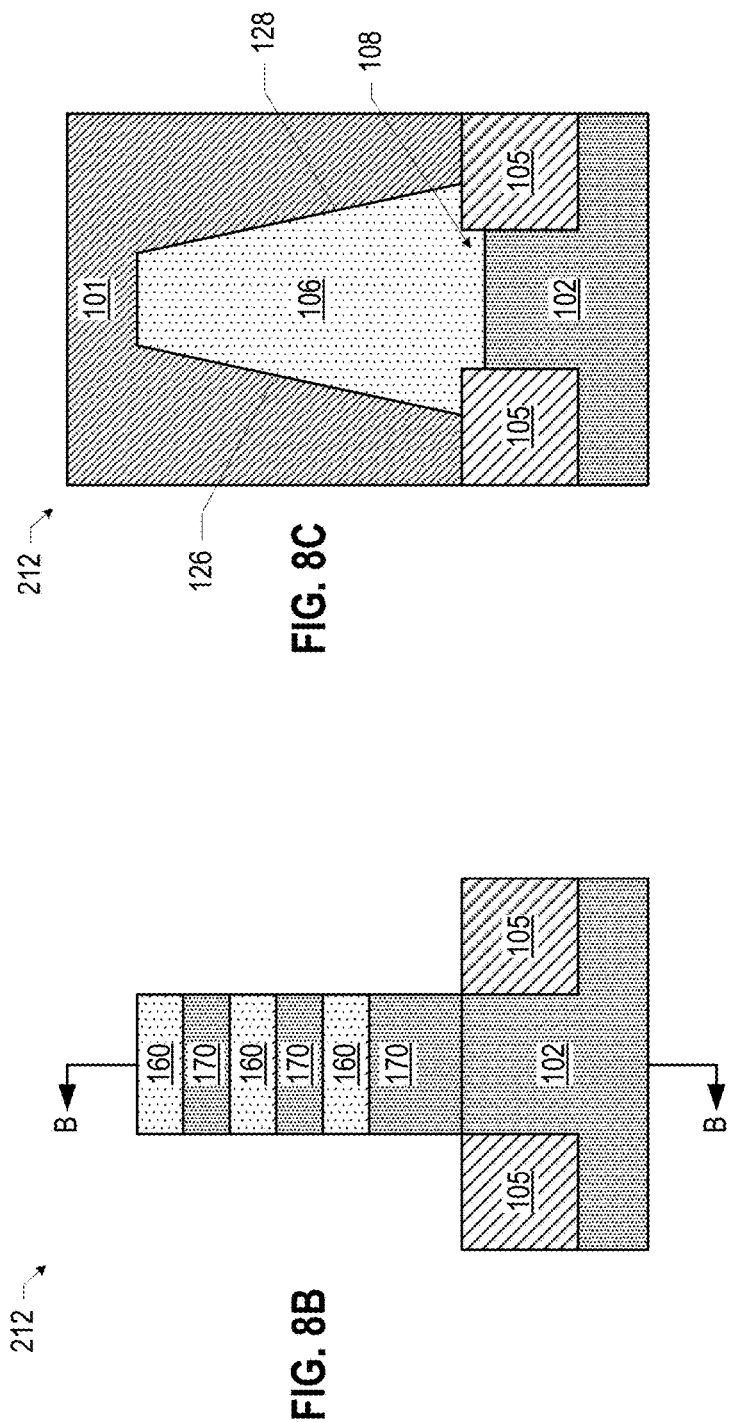
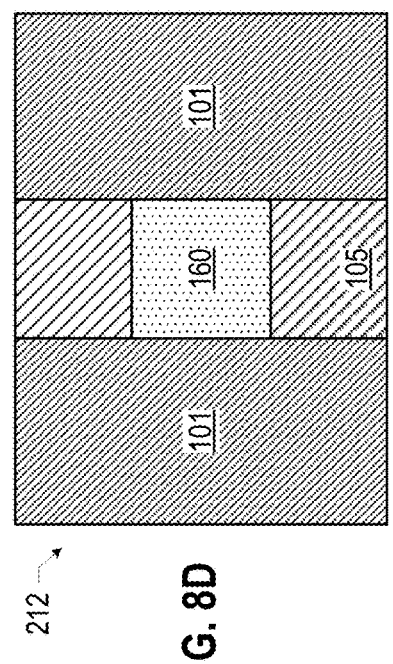
FIG. 8C
FIG. 8B
FIG. 8D

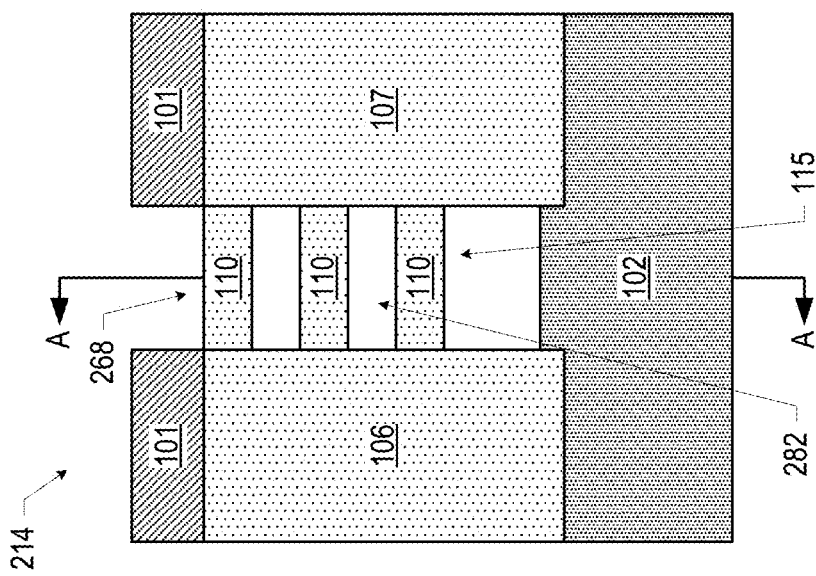

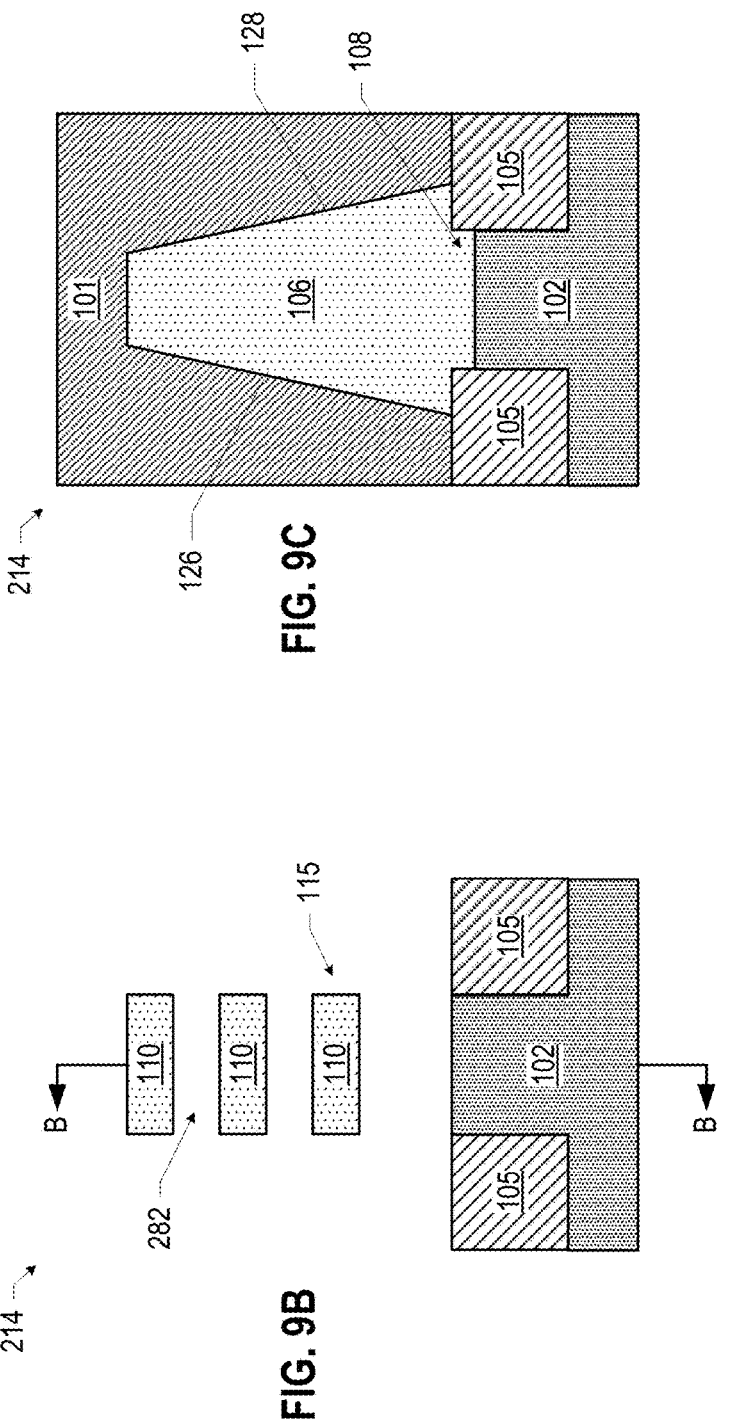

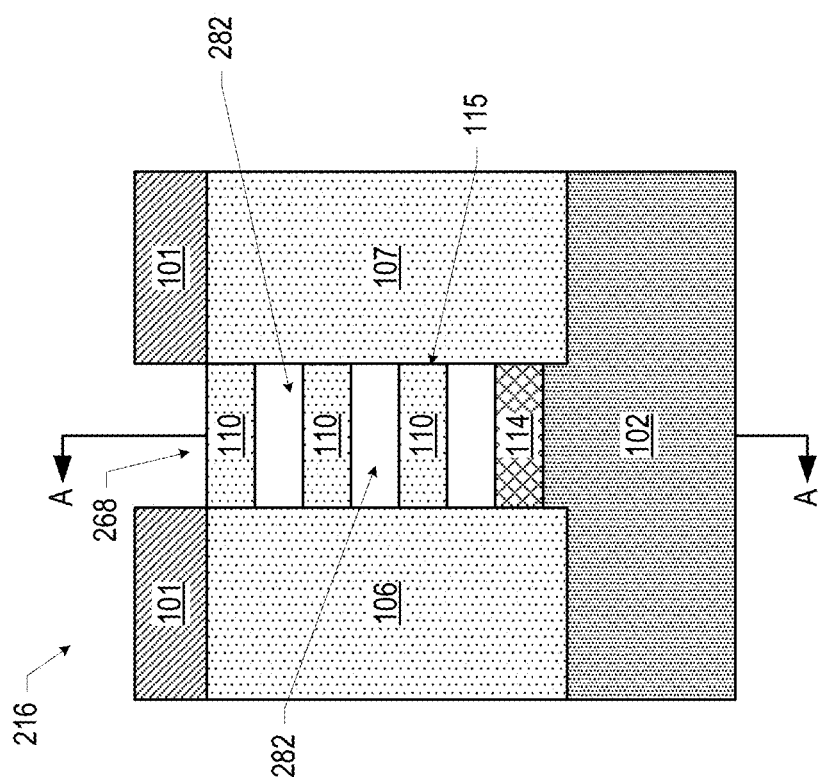

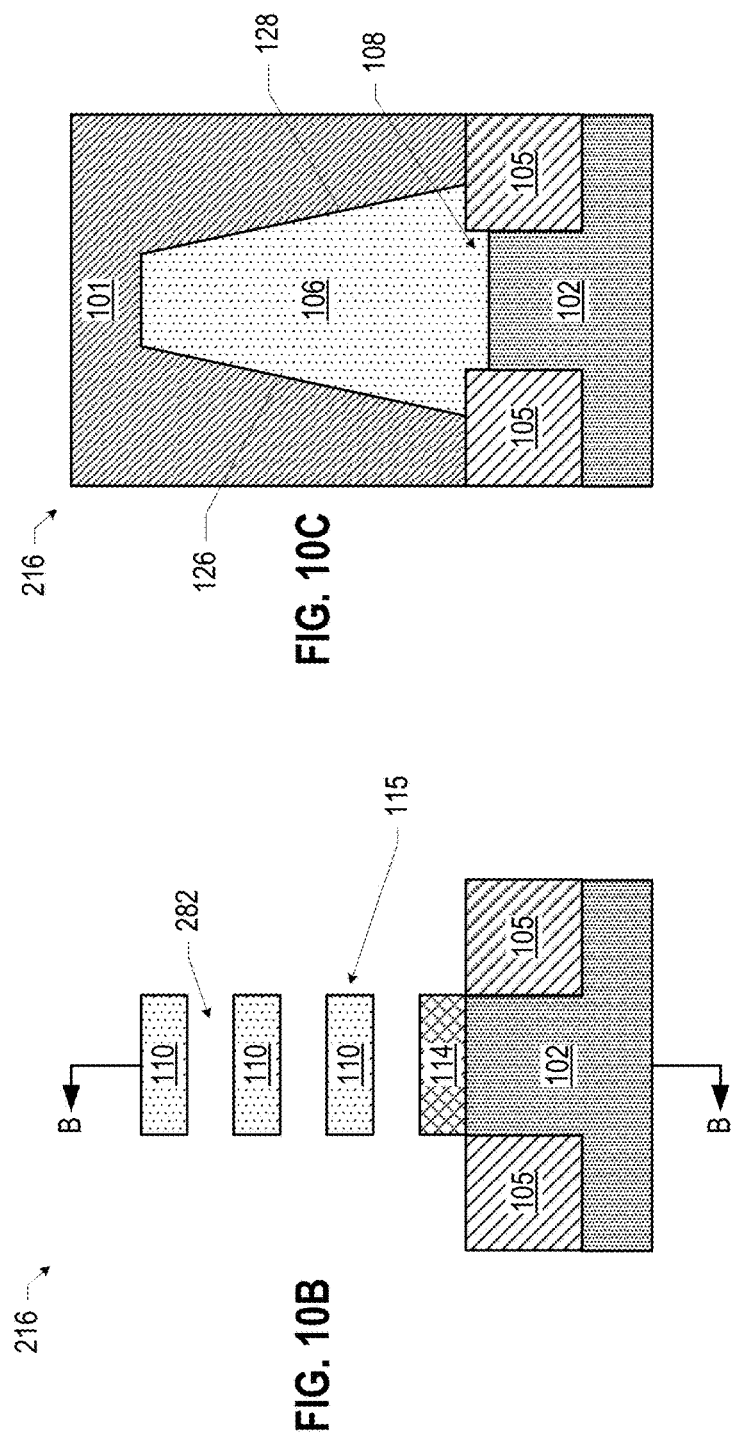

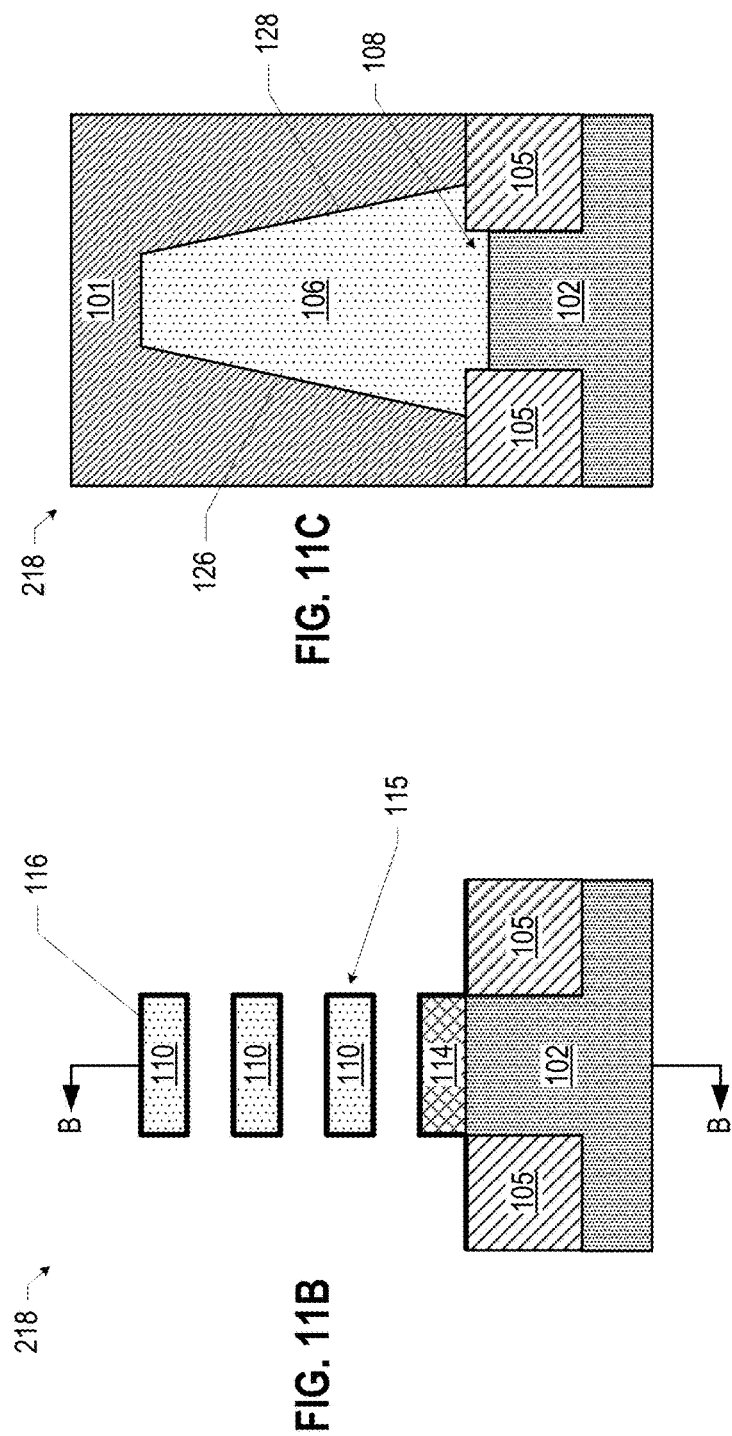
FIG. 11B
FIG. 11C
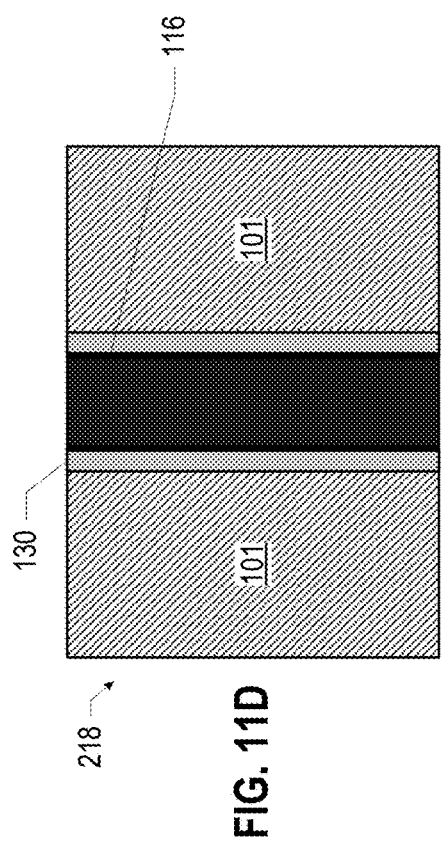
FIG. 11D

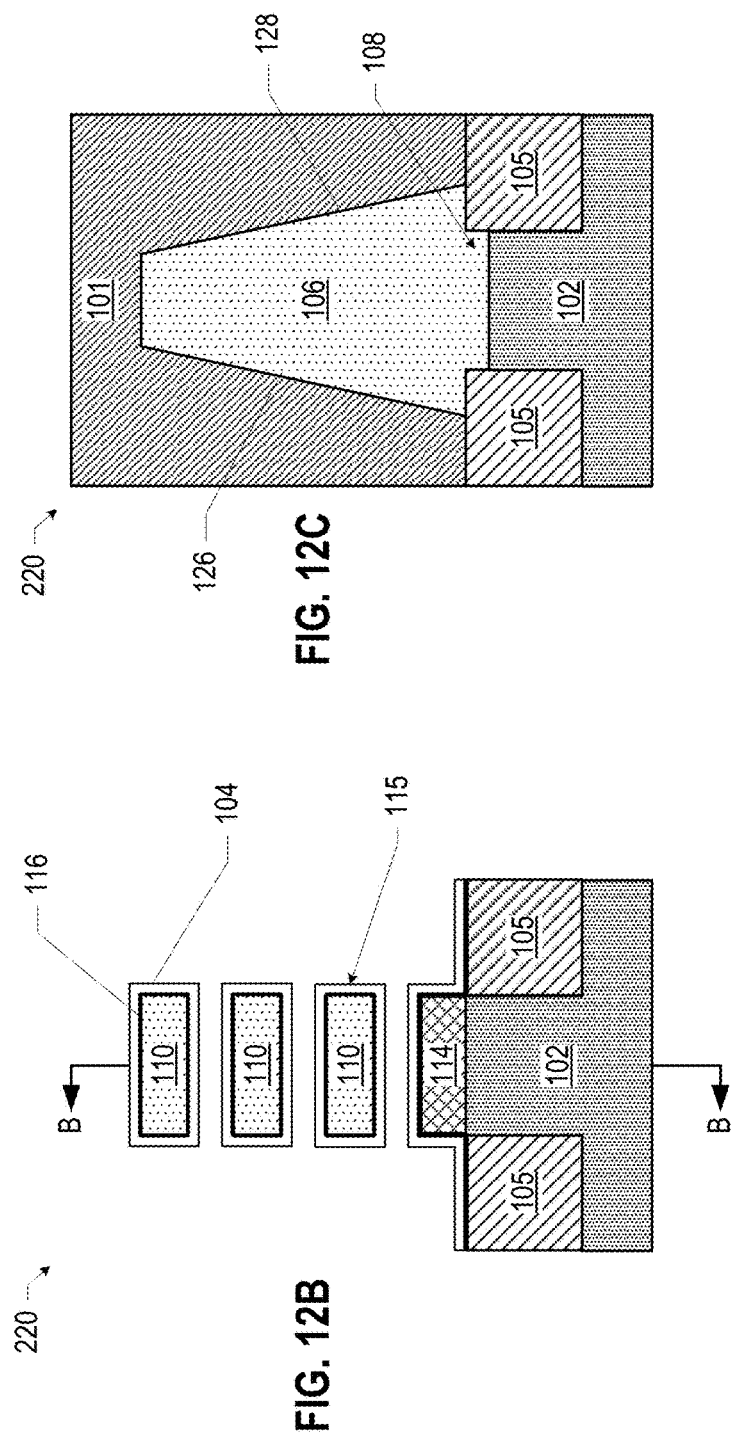
FIG. 12B
FIG. 12C
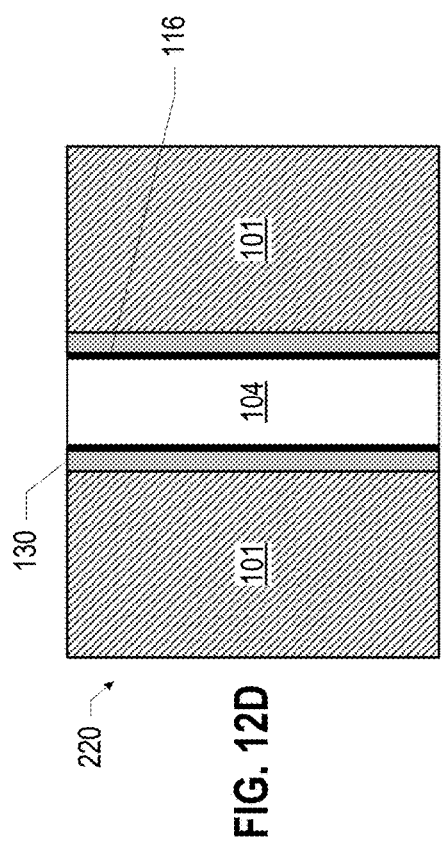
FIG. 12D

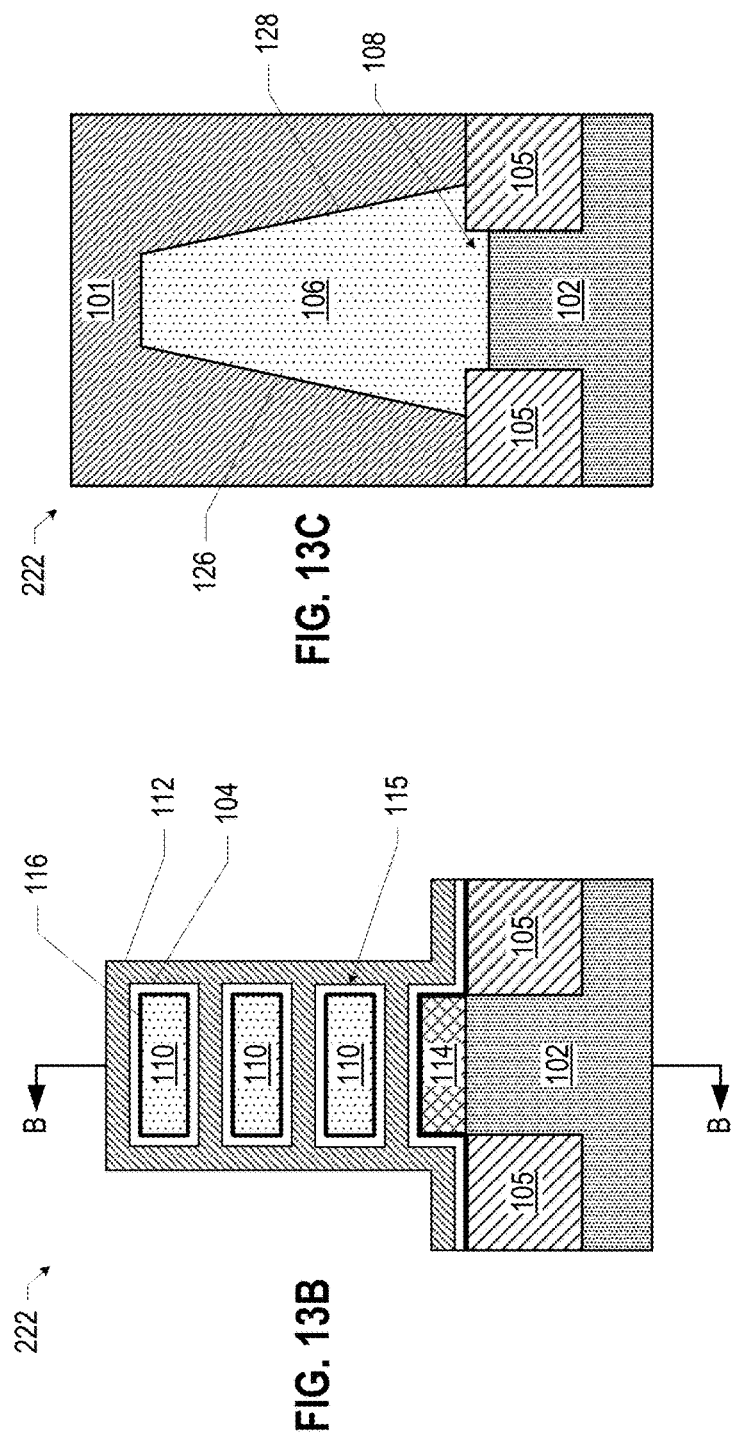
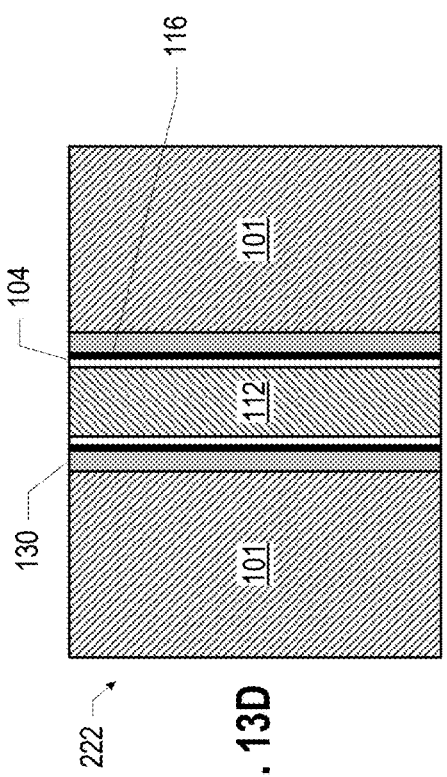
FIG. 13B
FIG. 13C
FIG. 13D

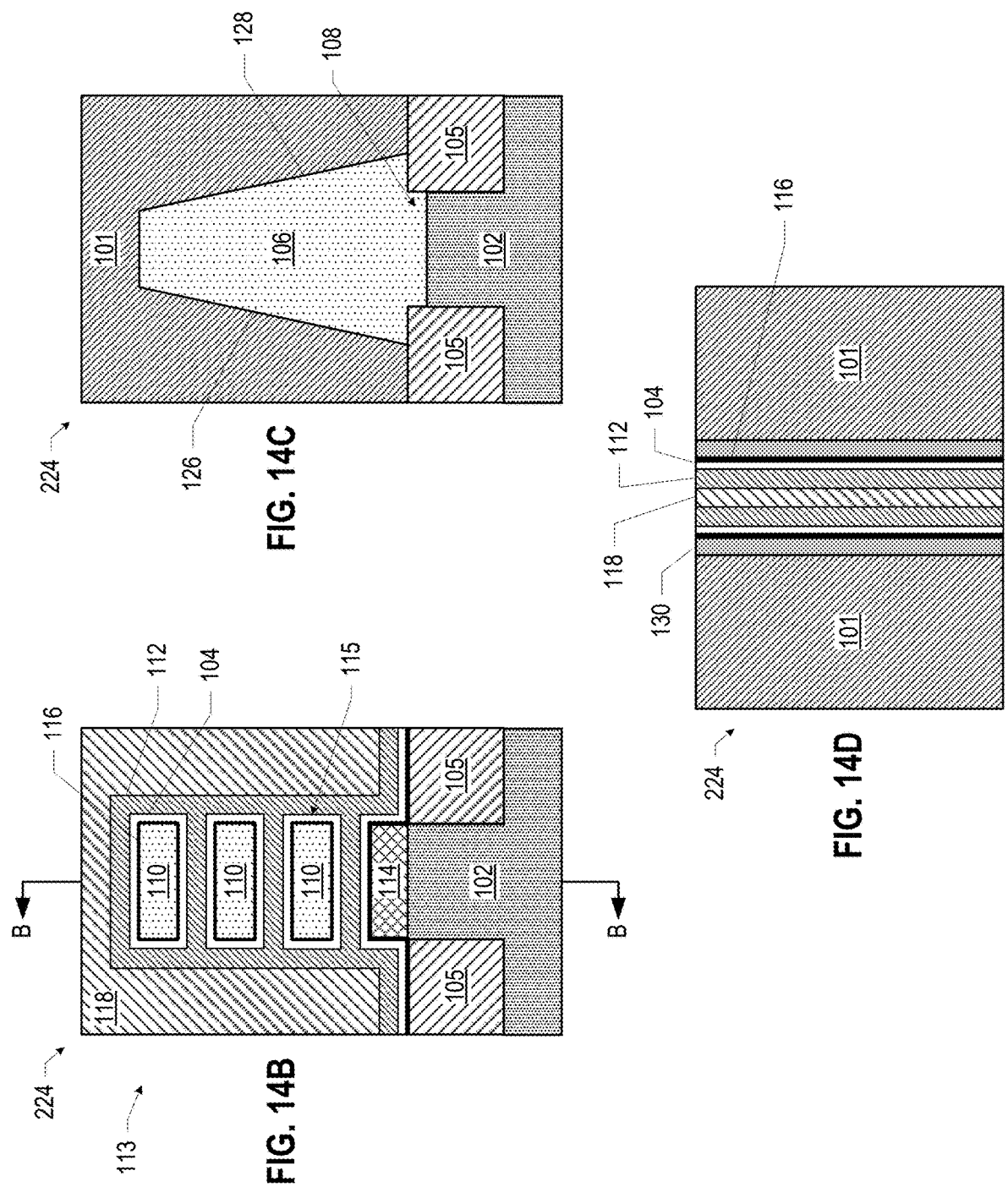

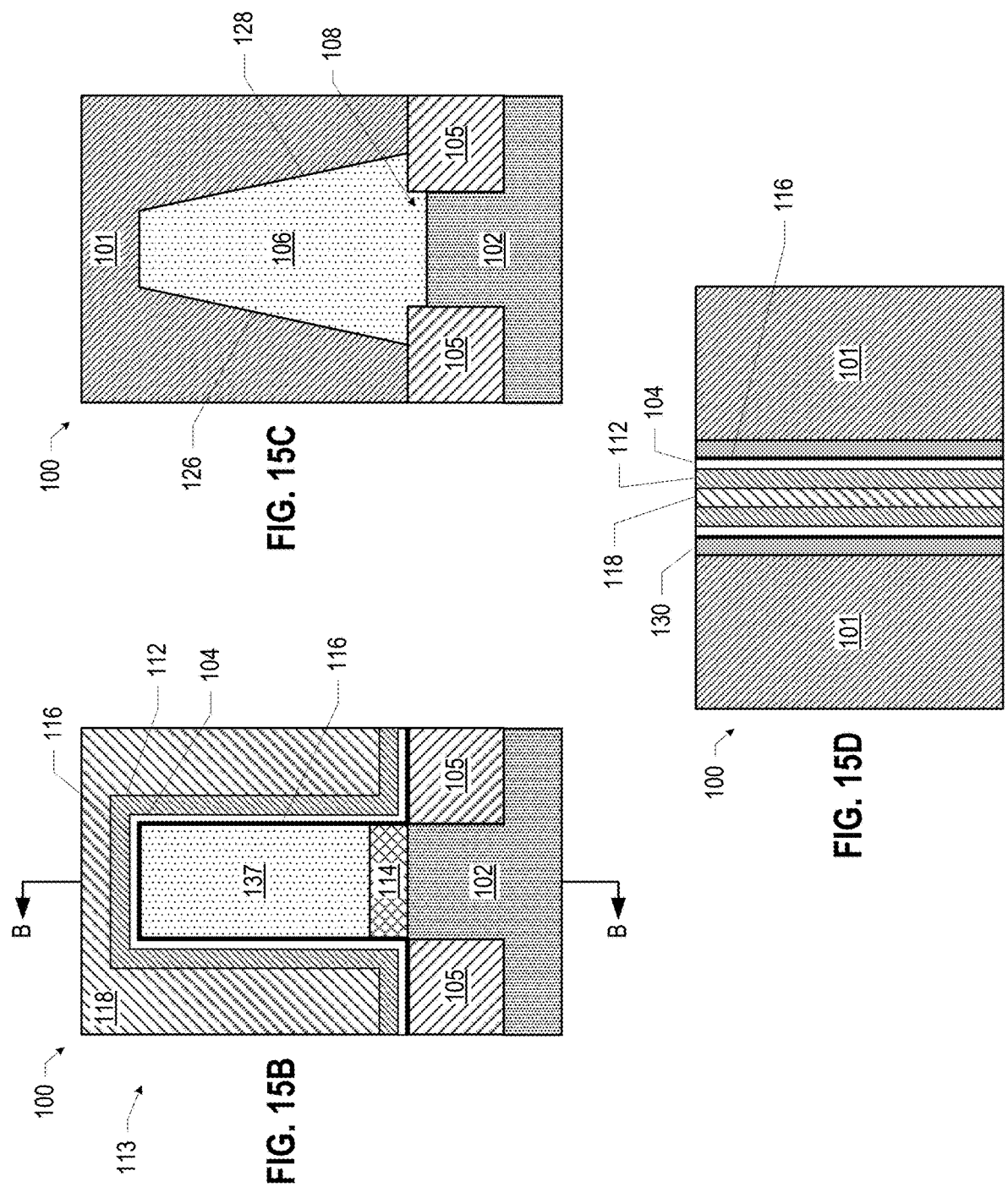

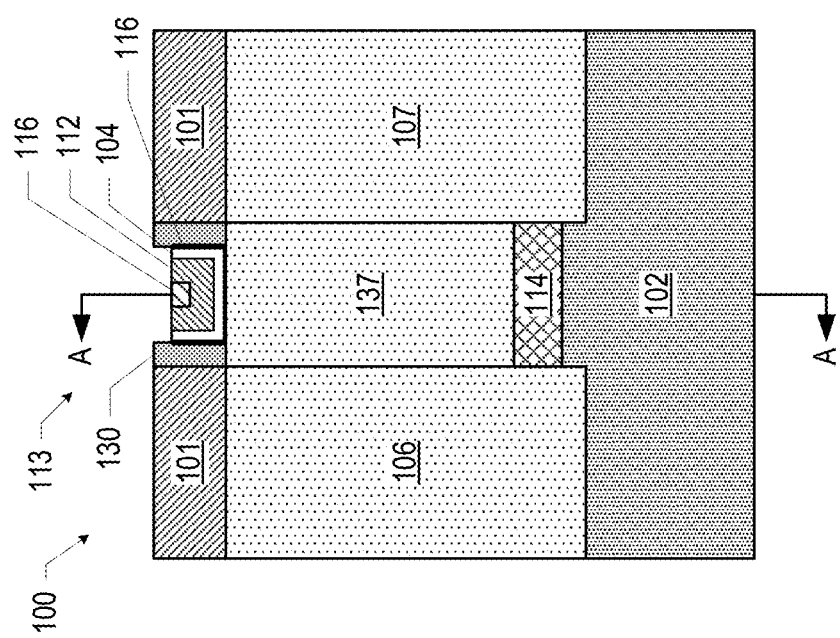

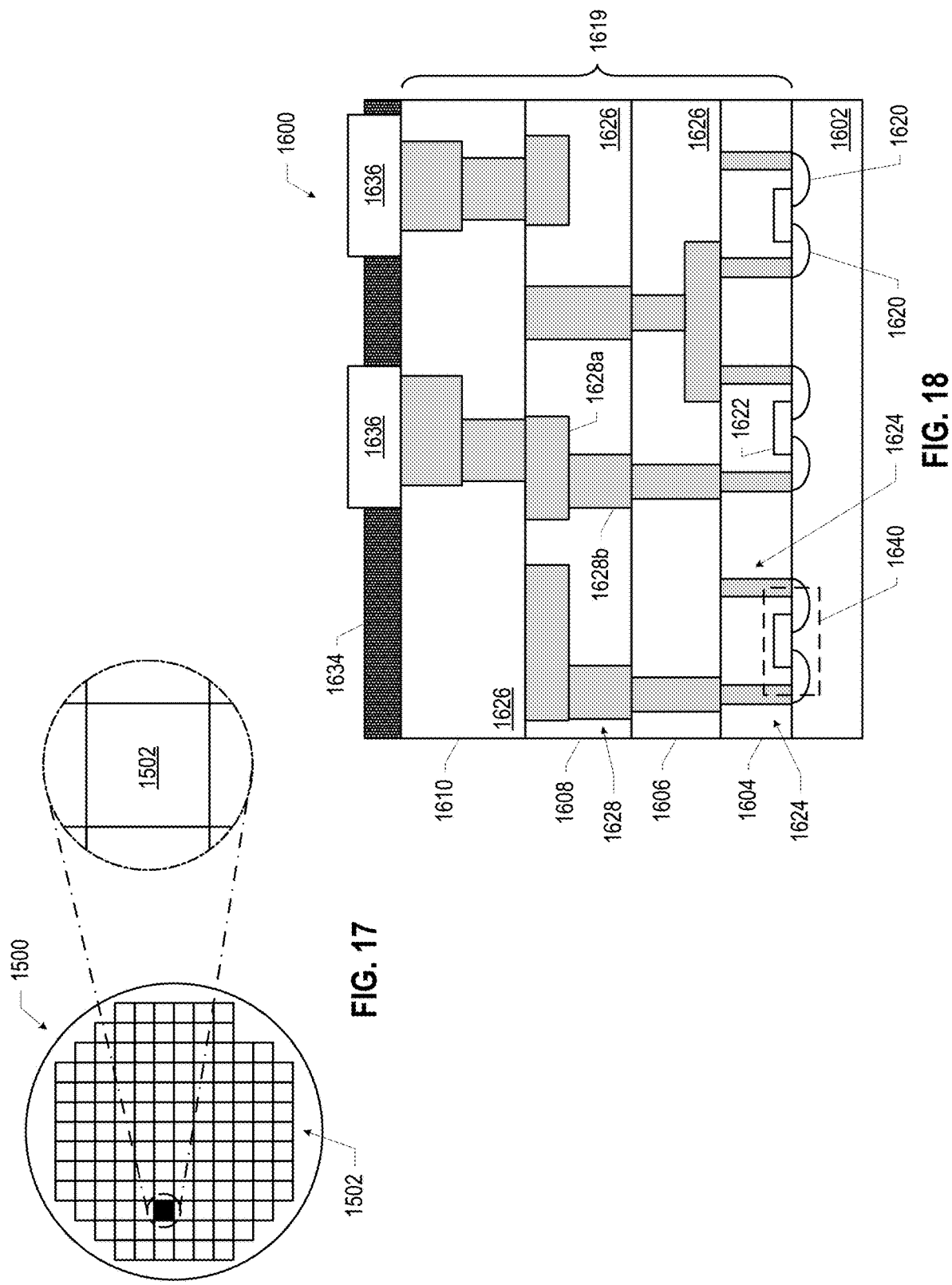

METALLIZATION IN INTEGRATED CIRCUIT STRUCTURES

BACKGROUND

The drive to reduce the size of integrated circuit (IC) structures is often hampered by technical challenges in the reliable manufacture of such structures. For example, the deposition of metals in small volumes may be limited by necking, voiding, and/or adhesion issues.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1D are views of an integrated circuit (IC) structure, in accordance with various embodiments.

FIGS. 2A-2D, 3A-3D, 4A-4D, 5A-5D, 6A-6D, 7A-7D, 8A-8D, 9A-9D, 10A-10D, 11A-11D, 12A-12D, 13A-13D, and 14A-14D are views of assemblies in different stages of the manufacture of an IC structure, in accordance with various embodiments.

FIGS. 15A-15D are views of another IC structure, in accordance with various embodiments.

FIG. 16 is a side, cross-sectional view of another IC structure, in accordance with various embodiments.

FIG. 17 is a top view of a wafer and dies that may include an IC structure, in accordance with any of the embodiments disclosed herein.

FIG. 18 is a side, cross-sectional view of an IC device that may include an IC structure, in accordance with any of the embodiments disclosed herein.

DETAILED DESCRIPTION

Figure 2A:
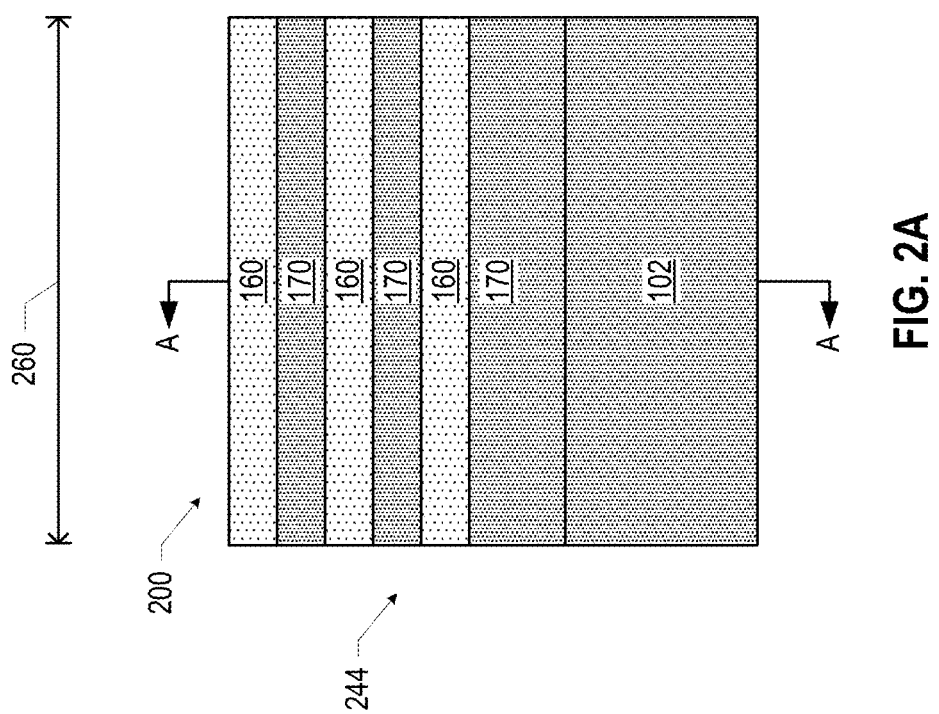
Figure 4A:
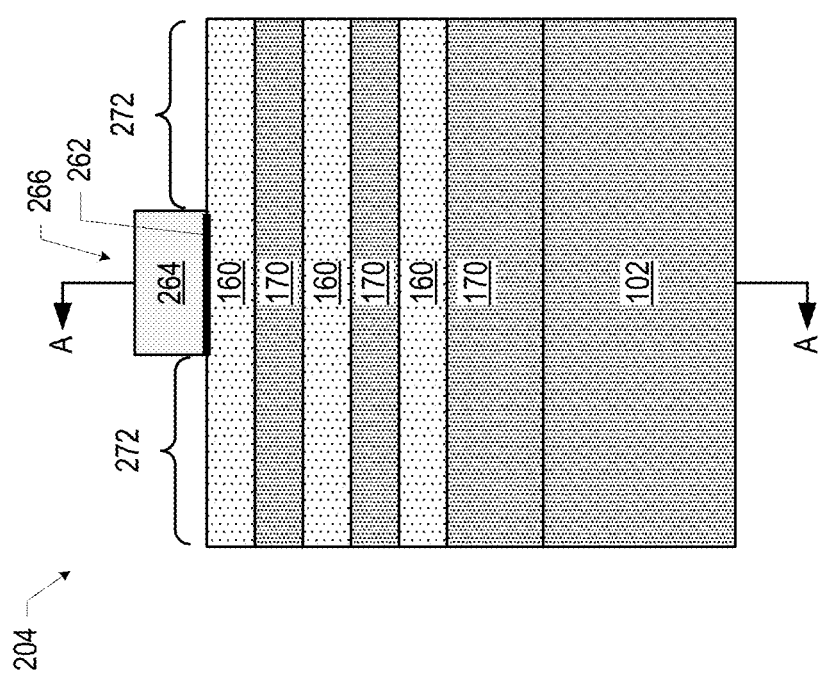
Figure 4B:
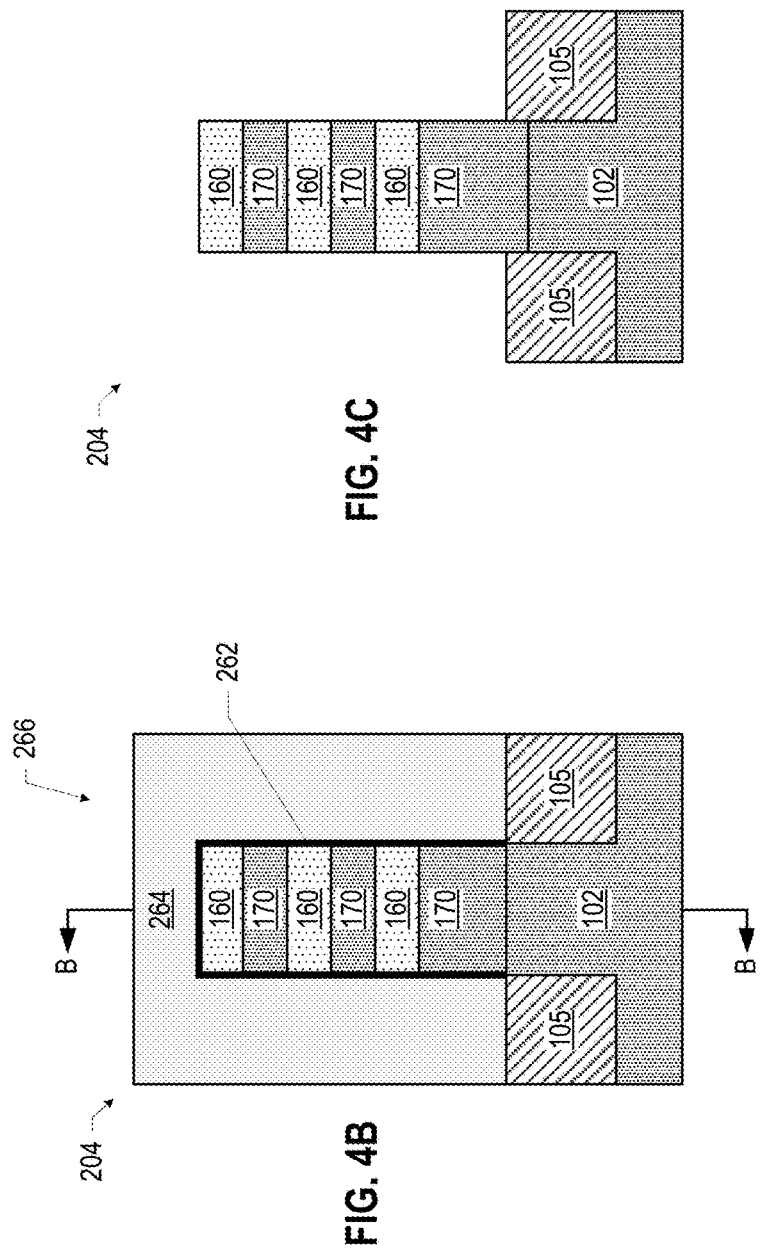
Figure 4C:
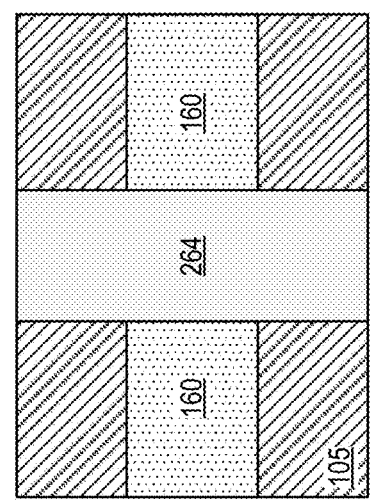
Figure 4D:
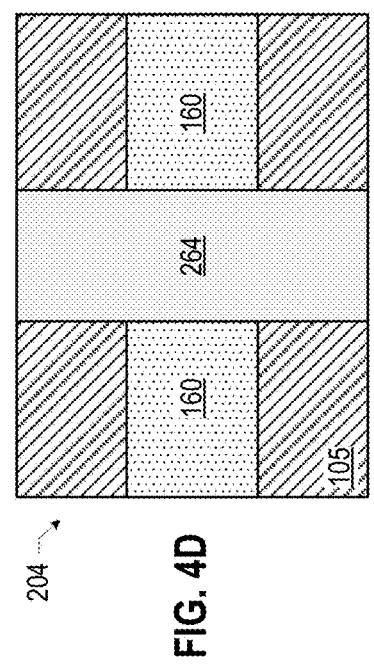
Figure 5A:
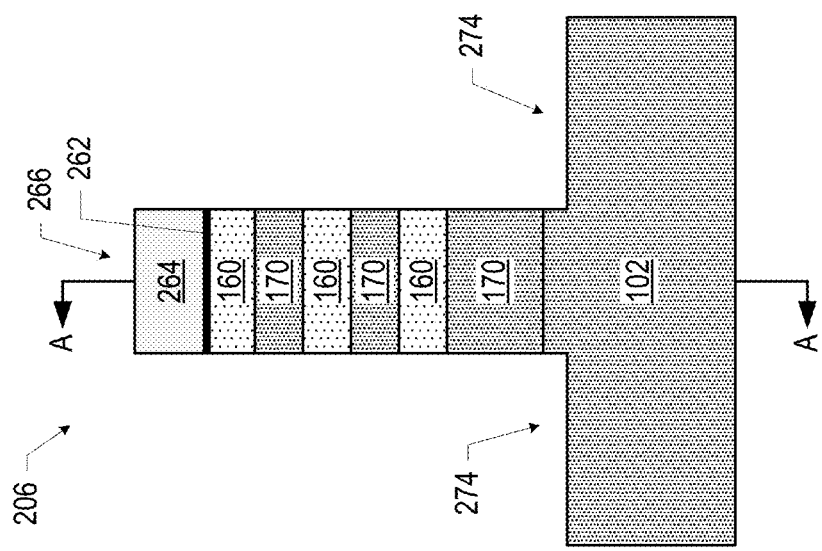
Figure 5C:
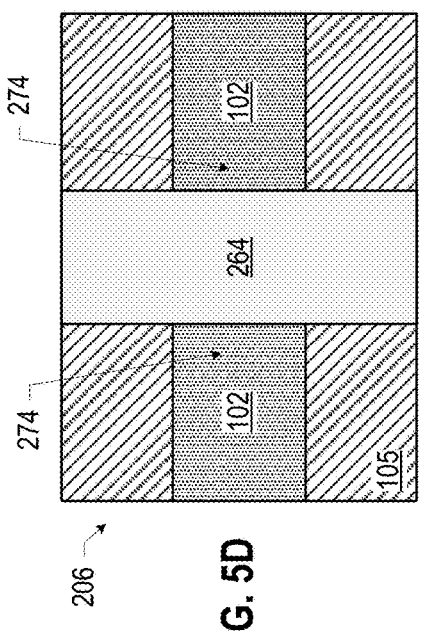
Figure 5D:
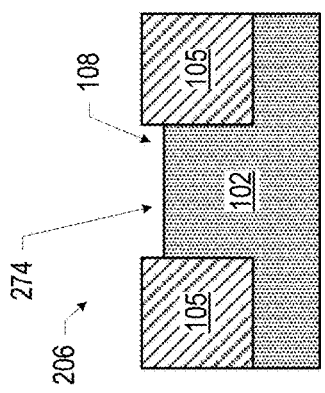
Figure 5B:
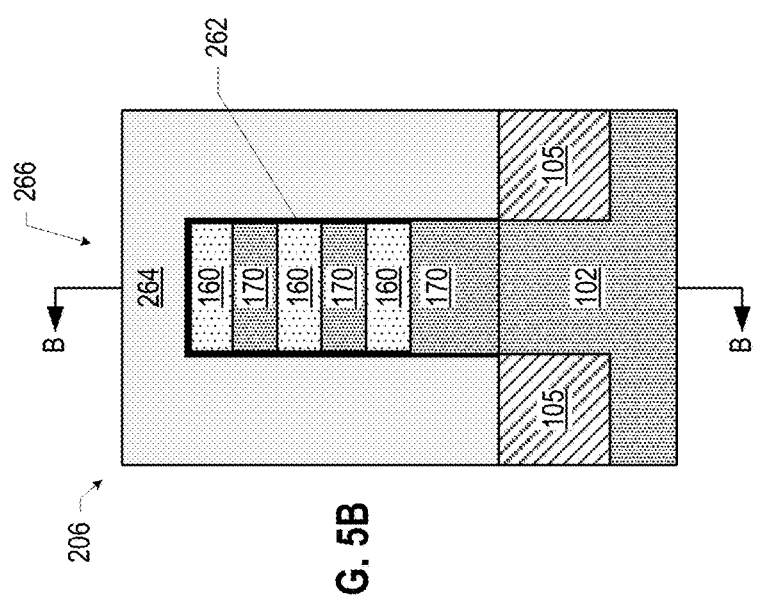
Figure 7A:
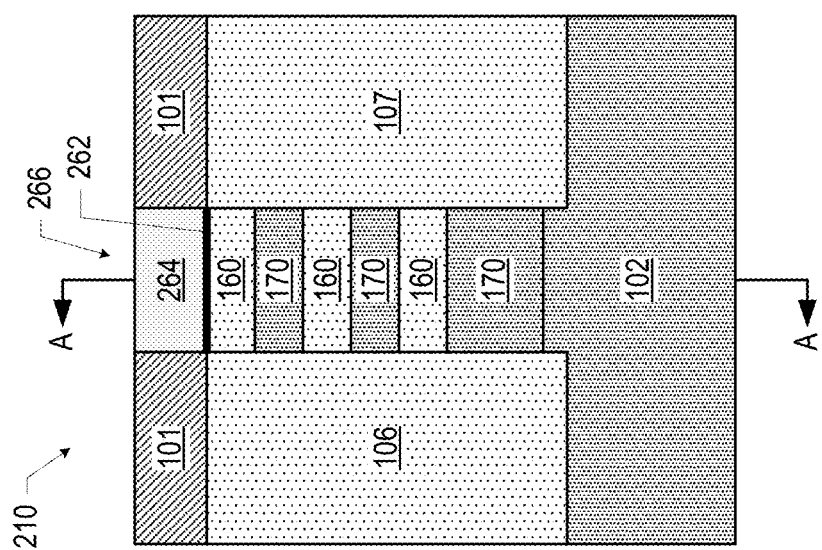
Figure 7C:
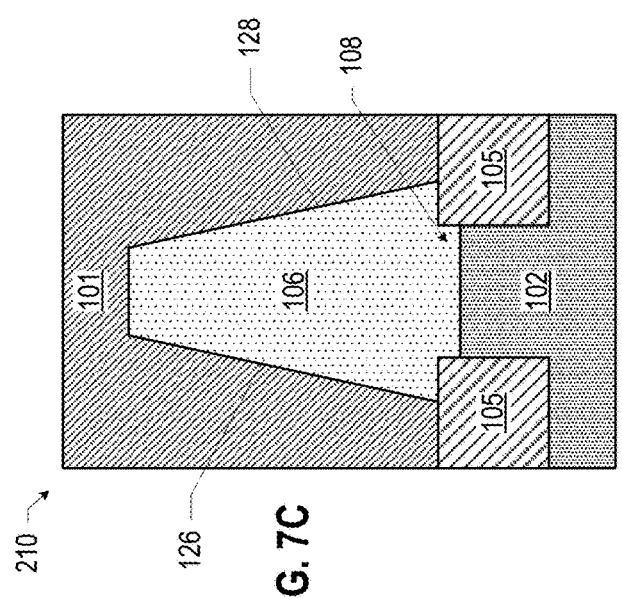
Figure 7D:
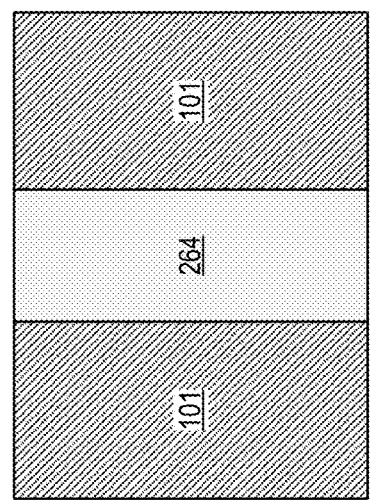
Figure 7B:
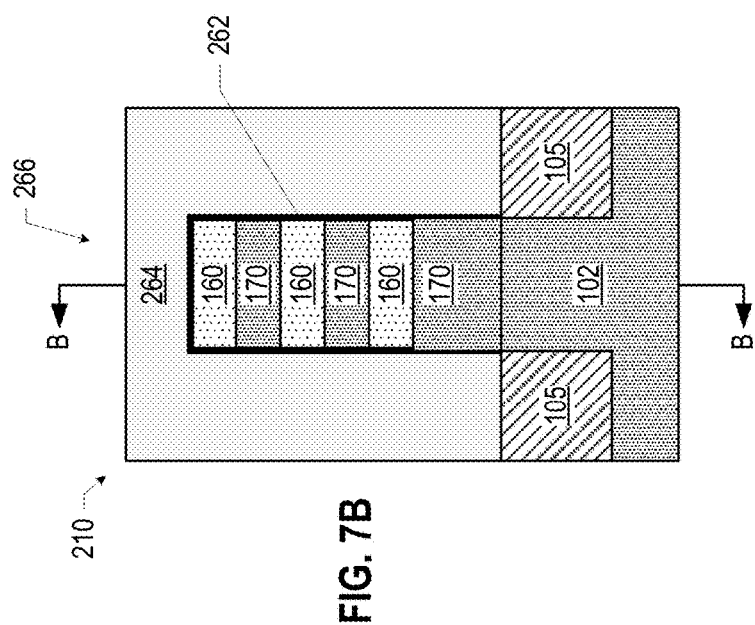

Disclosed herein are structures, methods, and assemblies related to metallization in integrated circuit (IC) structures. For example, in some embodiments, an IC structure may include a first nanowire in a metal region and a second nanowire in the metal region. A distance between the first nanowire and the second nanowire may be less than 5 nanometers, and the metal region may include tungsten between the first nanowire and the second nanowire.

The structures, methods, and assemblies disclosed herein may enable the use of metallization in IC structures that may have a higher quality than conventional approaches and/or may reduce the complexity of metallization fabrication operations relative to conventional approaches. For example, in an "NMOS first" transistor fabrication flow, the formation of a metallization stack for a PMOS transistor may include the deposition of a PMOS work function metal (e.g., titanium nitride), the deposition of an NMOS work function metal (e.g., aluminum titanium carbide), the deposition of a fill liner (e.g., titanium nitride), and the deposition of a metal fill (e.g., tungsten deposited using a fluorine-based atomic layer deposition (ALD) process). Utilizing the some of the embodiments disclosed herein, such a transistor fabrication flow may be simplified to include the deposition of a combined PMOS work function metal/fill liner (e.g., tungsten deposited using the chlorine-based ALD processes disclosed herein), and then the deposition of a metal fill (e.g., tungsten deposited using a fluorine-based ALD process). Such a simplified fabrication flow may decrease fabrication time and/or reduce costs.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, a "high-k dielectric material" may refer to a material having a higher dielectric constant than silicon oxide.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments.

The accompanying drawings are not necessarily drawn to scale. For ease of discussion, the term "FIG. 1" may be used to refer to the collection of drawings of FIGS. 1A-1D, the term "FIG. 2" may be used to refer to the collection of drawings of FIGS. 2A-2D, etc.

FIGS. 1A-1D are views of an IC structure 100, in accordance with various embodiments. FIG. 1A is a side cross-sectional view of the IC structure 100 along the longitudinal axes of the nanowires 110, FIG. 1B is a cross-sectional view taken through the section A-A of FIG. 1A (through the gate electrode 113), FIG. 1C is a side view taken toward the S/D region 106, and FIG. 1D is a top view. Although only a single IC structure 100 is depicted in FIG. 1, this is simply for ease of illustration, and an electrical device may include any number of the IC structures 100 (e.g., in an array or any other desired arrangement) of FIG. 1. The IC structure 100 of FIG. 1 may be a gate-all-around transistor.

The IC structure 100 may include a substrate 102 having a top surface. Source/drain (S/D) regions 106 and 107 may be disposed on the top surface of the substrate 102, and one or more nanowires 110 may be coupled between the S/D regions 106 and 107. An insulating material 101 may be disposed around the nanowires 110 and the S/D regions 106 and 107. The insulating material 101 may be an interlayer dielectric (ILD), such as undoped silicon oxide, doped silicon oxide (e.g., borophosphosilicate glass (BPSG) or phosphosilicate glass (PSG)), silicon nitride, silicon oxynitride, or any combination.

The IC structure 100 may include a gate including a gate electrode 113 and a gate dielectric 116. The gate electrode 113 may surround all of the nanowires 110, and a gate dielectric 116 may be disposed between the gate electrode 113 and the adjacent portions of the nanowires 110. As used herein, a gate electrode may be said to "surround" a nanowire if that gate electrode surrounds a portion of the nanowire (e.g., as illustrated in FIG. 1). In some embodiments, spacers 130 may "bookend" the gate electrode 113, as shown. The nanowires 110 included in the IC structure 100 may be arrayed in the z-direction (i.e., the direction of the thickness 131), and may provide transistor channels, as known in the art.

In some embodiments, the top surface of the substrate 102, the S/D regions 106 and 107, and the nanowires 110 each comprise a material having a lattice constant. The lattice constant of the top surface of the substrate 102 may be different from the lattice constants of the S/D regions 106 and 107 and the nanowires 110. In a particular embodiment, the lattice constants of the S/D regions 106 and 107 and the nanowires 110 may be larger than the lattice constant of the top surface of the substrate 102. The lattice mismatch (e.g., the lattice constant mismatch) between the S/D regions 106 and 107, the nanowires 110, and the top surface of the substrate 102 may result in lattice stress in the nanowires 110 and in the S/D regions 106 and 107. In one embodiment, the nanowires 110 and the S/D regions 106 and 107 may be uniaxially lattice-stressed in a direction parallel to the length 120 of the gate electrode 113, and may be lattice-relaxed in a direction perpendicular to the length 120 of the gate electrode 113. The lattice constant mismatch between the top surface of the substrate 102 and the S/D regions 106 and 107 may also result in the S/D regions 106 and 107 providing a force on the nanowires 110. This force may help to maintain the uniaxial lattice stress in the nanowires 110.

In some embodiments, a portion of the top surface of the substrate 102 may be recessed beneath the top surface of the shallow trench isolation (STI) material 105, forming a trench 108 in which the S/D regions 106 and 107 are disposed (e.g., as illustrated in FIG. 10). Forming the S/D regions 106 and 107 in the trench 108 may help to confine the growth of the S/D regions 106 and 107 during fabrication. However, the S/D regions 106 and 107 need not necessarily be formed in a trench; in some embodiments, for example, the top surface of the substrate 102 may be planar with or above the top surface of the STI material 105, and the S/D regions 106 and 107 may be disposed on that top surface of the substrate 102. In some embodiments, the S/D regions 106 and 107 may be <111>-faceted such that the width 122 at the bottom of the S/D regions 106 and 107 is greater than the width 124 at the top of S/D regions 106 and 107. In such an embodiment, the plane corresponding to sidewalls 126 and 128 may be the <111> lattice orientation of the S/D regions 106 and 107.

In some embodiments, the IC structure 100 may include a bottom gate isolation material 114 disposed on the top surface of the substrate 102 and under the bottom-most nanowire 115. The bottom gate isolation material 114 may serve as a capacitive isolation barrier to mitigate parasitic coupling between the top surface of the substrate 102 and the gate electrode 113. The effectiveness of the bottom gate isolation material 114 as a capacitive isolation barrier may depend at least in part on its thickness and material composition. In some embodiments, the bottom gate isolation material 114 may include any dielectric material, such as silicon oxide, silicon nitride, silicon oxynitride, low-k dielectric materials, etc. In some particular embodiments, the bottom gate isolation material 114 may include a silicon oxide layer. In some embodiments, the thickness of the bottom gate isolation material 114 may be sufficiently thick so as to isolate the top surface from capacitive coupling by the gate electrode 113. In some embodiments, a thickness 135 of the bottom gate isolation material 114 may be between 100 Angstroms and 300 Angstroms.

In some embodiments, the substrate 102 may include one or more epitaxial single-crystalline semiconductor layers (e.g., silicon, germanium, silicon germanium, gallium arsenide, indium phosphide, indium gallium arsenide, aluminum gallium arsenide, etc.) grown atop a distinct crystalline substrate (silicon, germanium, gallium arsenide, sapphire, etc.). In one such embodiment, the epitaxially grown semiconductor layers may provide one or more buffer layers having lattice constants different from the distinct crystalline substrate. The buffer layers may serve to grade the lattice constant from the distinct crystalline substrate to the top surface of the substrate 102. For example, the substrate 102 may include epitaxially grown silicon germanium (SiGe) buffer layers on a distinct crystalline silicon substrate. The germanium concentration of the SiGe buffer layers may increase their germanium content from the bottom-most buffer layer to the top-most buffer layer (e.g., from 0 atom-% germanium to 40 atom-% germanium), thereby gradually increasing the lattice constant of the substrate 102. In some embodiments, the substrate 102 may have a silicon-on-insulator (SOI) structure.

As noted above, STI material 105 may be disposed on the substrate 102. The STI material 105 may serve to reduce current leakage between IC structures 100 formed adjacent to one another. The STI material 105 may include any appropriate dielectric material, such as silicon oxide, silicon nitride, silicon oxynitride, a low-k dielectric, and any combination thereof.

The nanowires 110 may be disposed above the top surface of the substrate 102, and between the S/D regions 106 and 107. Although three nanowires 110 are depicted in FIG. 1, a IC structure 100 may include any suitable number of nanowires 110 (e.g., between two nanowires 110 and ten nanowires 110). The nanowires 110 may be formed from a material that can be reversely altered from an insulating state to a conductive state by applying external electric fields (e.g., a semiconductor material). For example, the nanowires 110 may be formed of Si, Ge, SiGe, GaAs, InSb, GaP, GaSb, InAlAs, InGaAs, GaSbP, GaAsSb, InP, and/or carbon nanotubes. In some particular embodiments, the nanowires 110 may include an undoped lattice-stressed single-crystalline semiconductor material having a carrier mobility greater than single-crystalline silicon. The absence of dopants in such nanowires 110 may reduce scattering of charge carriers and may help to improve carrier mobility and thus increase drive current. Lattice stress in the nanowires 110 may also enhance carrier mobility and improve device performance. In some embodiments, the nanowires 110 may be compressively stressed for enhanced hole mobility in p-type IC structures 100, and may be tensilely stressed for enhanced electron mobility in n-type IC structures 100. In some embodiments, the nanowires 110 may include a doped single-crystalline semiconductor material. For example, the nanowires 110 may be formed of doped single-crystalline silicon.

The nanowires 110 may run parallel to the top surface of the substrate 102, and multiple nanowires 110 may form a vertical array of nanowires. The nanowires 110 may have a thickness 131 and a width 132. In some embodiments, the thickness 131 may be between 4 nanometers and 20 nanometers (e.g., between 4 nanometers and 10 nanometers). In some embodiments, the width 132 may be between 5 nanometers and 50 nanometers. In some embodiments, the length 120 of a gate may be between 10 nanometers and 100 nanometers (e.g., between 20 nanometers and 40 nanometers, or equal to 30 nanometers). In some embodiments, the nanowires 110 may be ribbon-shaped nanowires in that the width 132 is greater than the thickness 131 of the nanowires 110. In some embodiments, the inter-nanowire spacing 133 between adjacent nanowires 110 may be between 3 nanometers and 200 nanometers (e.g., between 3 nanometers and 5 nanometers). In some embodiments, the cross-section of the nanowires 110 may be circular or oval-shaped rather than rectangular as shown.

In some embodiments, the S/D regions 106 and 107 may be disposed at opposite ends of the nanowires 110 and may be electrically coupled to the nanowires 110. The S/D regions 106 and 107 may be formed of any suitable material. For example, the S/D regions 106 and 107 may include an epitaxially grown single-crystalline semiconductor such as, but not limited to, Si, Ge, GeSn, SiGe, GaAs, InSb, GaP, GaSb, InAlAs, InGaAs, GaSbP, GaAsSb, GaN, GaP, or InP. In some embodiments, the S/D regions 106 and 107 may include a single-crystalline semiconductor material having a lattice constant different from the lattice constant of the top surface of the substrate 102. As previously described, the lattice constant mismatch between the S/D regions 106 and 107 and the top surface of the substrate 102 may create lattice stress in the S/D regions 106 and 107, thereby improving electron mobility. In some embodiments, the S/D regions 106 and 107 include the same single-crystalline semiconductor material included in the nanowires 110.

In some embodiments, the lattice constant of the S/D regions 106 and 107 may be larger than the lattice constant of the top surface of the substrate 102. In such an embodiment, the S/D regions 106 and 107 may be compressively stressed and may provide a compressive force on the nanowires 110. In a specific example of such an embodiment, the S/D regions 106 and 107 may be epitaxial single-crystalline germanium and the top surface of the substrate 102 may be epitaxial single-crystalline silicon germanium. In this example, the germanium S/D regions 106 and 107 may exert a compressive force on the nanowires 110. In some embodiments, the top surface of the substrate 102 may include a semiconductor material (e.g., silicon germanium) having a first lattice constant, the nanowires 110 may include a second semiconductor material (e.g., germanium) having a second lattice constant greater than the first lattice constant, and the S/D regions 106 and 107 may include a third semiconductor material (e.g., gallium arsenide (GaAs)) having a third lattice constant greater than the second lattice constant to further enhance the compressive stress in the nanowires 110.

In some embodiments, the lattice constant of the S/D regions 106 and 107 may be smaller than the lattice constant of the top surface of the substrate 102. In such an embodiment, the S/D regions 106 and 107 may be tensilely stressed and may provide a tensile force on the nanowires 110. In some such embodiments, the top surface of the substrate 102 may include a single-crystalline semiconductor material having a first lattice constant, the nanowires 110 may include a second semiconductor material having a second lattice constant less than the first lattice constant, and the S/D regions 106 and 107 may include a third semiconductor material having a third lattice constant less than the second lattice constant to further enhance the tensile stress in the nanowires 110.

The S/D regions 106 and 107 may have an n-type conductivity or a p-type conductivity. In some embodiments, the S/D regions 106 and 107 may have a doping concentration between $1\times10^{18}$ atoms/cm$^3$ to $1\times10^{21}$ atoms/cm$^3$. The S/D regions 106 and 107 may have a uniform doping concentration or may include sub-regions of different concentrations or dopant profiles. In some embodiments, the S/D regions 106 and 107 may have the same doping concentration profile; in other embodiments, the doping concentration profiles of the S/D regions 106 and 107 may differ from each other.

In some embodiments, the S/D regions 106 and 107 may be formed, as described in greater detail below, by first removing portions of the fin used to create the nanowires 110 and then epitaxially growing the S/D regions 106 and 107. For example, in some embodiments, portions of the fin used to create the nanowires 110 may be removed, and then the S/D regions 106 and 107 may be epitaxially grown from the top surface of the substrate 102. The lattice of these epitaxially deposited S/D regions 106 and 107 may continue from the lattice of the top surface of the substrate 102. That is, the lattice of the underlying substrate 102 may dictate the lattice direction and growth of the overlying S/D regions 106 and 107. The use of such S/D regions 106 and 107 may improve device performance in some embodiments by providing an additional force to the nanowires 110. In some embodiments, the use of S/D regions 106 and 107 may also improve performance by providing anchors to the nanowires 110 that help maintain the uniaxial stress in the nanowires 110 already present from earlier fabrication processes, such as fin patterning. The S/D regions 106 and 107 may be stressed and, thus, may further stress the adjacent nanowires 110. The stress in the nanowires 110 may be further enhanced by using a material for the S/D regions 106 and 107 that has a different lattice constant than the material used to form the nanowires 110 (e.g., different semiconductor materials).

In the IC structure 100, a gate dielectric 116 may be disposed on and all around each nanowire 110. The gate dielectric 116 may include any suitable gate dielectric, such as, but not limited to, silicon oxide, silicon oxynitride, and silicon nitride. In some embodiments, the gate dielectric 116 may include a high-k gate dielectric layer, such as a metal oxide dielectric (e.g., tantalum oxide, titanium oxide, hafnium oxide, hafnium silicon oxynitride, zirconium oxide, etc.). In some particular embodiments, the gate dielectric 116 may include hafnium. The gate dielectric 116 may also include other types of high-k dielectric layers, such as, but not limited to, lead zirconate titanate (PZT) or barium strontium titanate (BST). The gate dielectric 116 may include any combination of the above dielectric materials; in some embodiments, the gate dielectric 116 may include multiple different layers of dielectric materials. In some embodiments, the gate dielectric 116 may have a thickness between 10 Angstroms and 60 Angstroms. In a specific embodiment, the gate dielectric 116 includes HfO$_2$ and has a thickness between 1 nanometer and 6 nanometers.

As noted above, a gate electrode 113 may surround a portion of each of the nanowires 110, and the gate dielectric 116 may be disposed between the gate electrode 113 and the nanowires 110. The gate electrode 113 may include a first liner material 104, a second liner material 112, and a fill material 118. In some embodiments, the first liner material 104 may include titanium and nitrogen (e.g., in the form of titanium nitride), and may have a thickness that is less than 5 Angstroms. The second liner material 112 may include tungsten, and may be formed using a chlorine-based ALD process, as discussed further below with reference to FIG. 13. In some embodiments, the second liner material 112 may have a thickness that is less than 30 Angstroms (e.g., between 10 Angstroms and 30 Angstroms). The first liner material 104 may be between the second liner material 112 and the gate dielectric 116, and the first liner material 104 and the second liner material 112 may together provide workfunction tuning and/or may improve adhesion and nucleation for the fill material 118. In some embodiments, the combined thickness of the first liner material 104 and the second liner material 112 may be less than 3 nanometers. In some embodiments, the fill material 118 may include tungsten, and may be formed using a chemical vapor deposition (CVD) process, as discussed further below with reference to FIG. 14. In some embodiments, the fill material 118 may include molybdenum.

As illustrated in FIG. 1, in some embodiments, the gate dielectric 116, the first liner material 104, and the second liner material 112 may fill the volume between adjacent nanowires 110, and thus the fill material 118 may be present in the portions of the gate electrode 113 outside of this inter-nanowire volume. When the second liner material 112 includes tungsten, the tungsten of the second liner material 112 may therefore be between adjacent nanowires 112, even when the inter-nanowire spacing 133 is small (e.g., less than 5 nanometers). Conventional electrode structures typically utilize thick layers of titanium nitride as a liner before providing a tungsten fill, and thus can not achieve tungsten penetration between adjacent, closely spaced nanowires.

When a chlorine-based ALD process is used to form the second liner material 112, the ratio of chlorine to fluorine in the inter-nanowire volume of the gate electrode 113 may be greater than the ratio of chlorine to fluorine in the portions of the gate electrode 113 outside of the inter-nanowire volume (e.g., the portions of the gate electrode corresponding to the fill material 118).

When a chlorine-based ALD process is used to form the second liner material 112 (instead of, for example, a fluorine-based ALD process) and the fill material 118 includes CVD tungsten, the sizes of the tungsten grains in the CVD fill material 118 may be considerably smaller than the sizes of tungsten grains in a CVD fill material 118 formed directly on titanium nitride (e.g., formed directly on the first liner material 104). In some particular embodiments, the average grain size of the tungsten in the fill material 118 may be less than 8 nanometers (e.g., less than 6 nanometers, or between 3 nanometers and 6 nanometers), while the average grain size of tungsten formed by CVD on titanium nitride may be greater than 8 nanometers (e.g., greater than 10 nanometers).

A gate electrode 113 that includes a second liner material 112 including tungsten formed by a chlorine-based ALD process may also achieve tungsten penetration between closely spaced nanowires 110, a result not achievable using conventional techniques. For example, a gate electrode 113 including a chlorine-based ALD tungsten second liner material 112 may exhibit tungsten penetration between adjacent nanowires 110 for inter-nanowire spacings 133 less than 5 nanometers (e.g., between 3 nanometers and 5 nanometers).

The IC structures 100 disclosed herein may be fabricated using any suitable techniques. For example, FIGS. 2-14 provide various views of assemblies in different stages of the manufacture of the IC structure 100 of FIG. 1, in accordance with various embodiments. In FIGS. 2-14, the "A" sub-figures represent a cross-sectional view analogous to that of FIG. 1A, the "B" sub-figures represent a cross-sectional view analogous to that of FIG. 1B, the "C" sub-figures represent a cross-sectional view analogous to that of FIG. 1C, and the "D" sub-figures represent a top view analogous to that of FIG. 1D.

FIG. 2 depicts an assembly 200 including a substrate 102 with a fin 244 formed thereon. The substrate 102 may provide the material upon which the IC structure 100 is formed, and may take any of the forms discussed above.

The fin 244 may include alternating layers of a semiconductor material 160 and a sacrificial material 170. As discussed below, the layers of semiconductor material 160 may be formed into the nanowires 110. In some embodiments, the layers of sacrificial material 170 may induce lattice stress on the layers of semiconductor material 160 by being lattice-mismatched to the layers of semiconductor material 160. The layers of semiconductor material 160 may include any suitable materials, such as the materials discussed above with reference to the nanowires 110. The layers of sacrificial material 170 may be formed from any suitable materials, such as any material that may be suitably selectively etched relative to the semiconductor material 160.

The fin 244 may be formed by first blanket-depositing alternating layers of semiconductor material 160 and sacrificial material 170 on the top surface of the substrate 102 using conventional epitaxial CVD methods. Next, the blanket layers of semiconductor material 160 and sacrificial material 170, and the substrate 102, may be patterned using conventional photolithography and etching methods to define the fin 244. As shown, the substrate 102 may also be etched so that a bottom portion of the fin 244 includes a portion of the substrate 102.

The assembly 200 may include an STI material 105, which may take any of the forms disclosed herein. In some embodiments, the STI material 105 may be formed by first blanket-depositing the STI material 105 on the substrate 102 and over the fin 244 using conventional CVD methods. The STI material 105 may be initially deposited to a thickness greater than the height of the fin 244. Next, the STI material 105 may be planarized using a conventional chemical mechanical planarization (CMP) method, and then recessed using a conventional etch method to expose the fin 244. In some embodiments, the STI material 105 may be recessed below the top surface of the substrate 102 so that the bottom portion of the fin 244 is formed from the substrate 102, as illustrated.

The fin 244 may have sidewalls 242 and 246, a fin height 256, a fin width 258, and a fin length 260. In some embodiments, the sidewalls 242 and 246 may be unconstrained planes, which may allow the fin 244 to lattice-relax in the direction perpendicular to the fin length 260. In some embodiments, the fin 244 may be uniaxially lattice-stressed in a direction parallel to the fin length 260 and lattice-relaxed in a direction perpendicular to the fin length 260. The thicknesses of the layers of semiconductor material 160 and the layers of sacrificial material 170 may depend on the desired dimensions and spacings of the nanowires 110; in particular, the thickness 131 of the nanowires 110 may correspond to the thicknesses of the corresponding layers of semiconductor material 160, and the inter-nanowire spacing 133 and the thickness 135 of the bottom gate isolation material 114 may correspond to the thicknesses of the corresponding layers of sacrificial material 170. In some embodiments, the fin 244 may have a fin width 258 between 5 nanometers and 500 nanometers. The fin height 256 may depend upon the desired number of nanowires 110 to be formed; in some embodiments, the fin height 256 may be between 15 nanometers and 200 nanometers.

FIG. 3 illustrates an assembly 202 subsequent to providing a sacrificial gate dielectric 262 and a sacrificial gate electrode material 264 over the fin 244 of the assembly 200 (FIG. 2). The sacrificial gate dielectric 262 may be blanket-deposited on top of the fin 244 and the sidewalls 242 and 246 of the fin 244. In some embodiments, the sacrificial gate dielectric 262 may be deposited to a thickness between 10 Angstroms and 50 Angstroms. A sacrificial gate electrode material 264 may then be blanket-deposited on the sacrificial gate dielectric 262 and over the fin 244. The sacrificial gate electrode material 264 may be deposited to a thickness that exceeds the fin height 256, and then may be planarized using conventional CMP methods.

FIG. 4 illustrates an assembly 204 subsequent to patterning the sacrificial gate dielectric 262 and the sacrificial gate electrode material 264 of the assembly 202 (FIG. 3) to form a sacrificial gate 266. Conventional photolithography and etching methods may be used to perform this patterning. The sacrificial gate 266 may serve to protect the underlying regions of the fin 244 during subsequent removal of sacrificial portions 272 of the fin 244, as discussed below.

During the patterning of the sacrificial gate dielectric 262 and the sacrificial gate electrode material 264, the sacrificial gate dielectric 262 on the sacrificial portions 272 of the fin 244 may be exposed on opposite sides of the sacrificial gate 266. The sacrificial gate dielectric 262 may serve as an etch stop layer during the patterning and formation of the sacrificial gate 266, thereby mitigating damage to the fin 244. In some embodiments, the sacrificial gate dielectric 262 and the sacrificial gate electrode material 264 may be formed from materials that have sufficiently different etch selectivity so that the sacrificial gate dielectric 262 may serve as an etch stop layer for etching the sacrificial gate electrode material 264 to form the sacrificial gate 266. In a particular embodiment, the sacrificial gate dielectric 262 may be a dielectric layer (e.g., silicon oxide, silicon nitride, and silicon oxynitride) and the sacrificial gate electrode material 264 may be a semiconductor material (e.g., polycrystalline silicon). After patterning the sacrificial gate electrode material 264, the sacrificial gate dielectric 262 may be removed from the top and the sidewalls 242 and 246 of the sacrificial portions 272 of the fin 244 (e.g., using a conventional wet etch process) to expose the sacrificial portions 272 of the fin 244. In an embodiment in which the sacrificial gate dielectric 262 is a silicon oxide layer, the sacrificial gate dielectric 262 may be removed using a dilute hydrogen fluoride (HF) wet etch.

FIG. 5 illustrates an assembly 206 subsequent to removing the sacrificial portions 272 of the fin 244 of the assembly 204 (FIG. 4) to expose regions 274 of the substrate 102. The sacrificial portions 272 of the fin 244 may be removed using conventional etching methods, such as wet etching or plasma dry etching. In an embodiment in which the layers of semiconductor material 160 are germanium and the layers of sacrificial material 170 are silicon germanium, a wet etchant such as ammonium hydroxide or tetramethylammonium hydroxide (TMAH) solution may be used to selectively etch off the sacrificial portions 272 of the fin 244. The sacrificial gate 266 may protect the underlying portions of the fin 244 during this etch. In an embodiment, the top surface of the substrate 102 may be recessed during the removal of the sacrificial portions 272 of the fin 244 to form a trench 108. The trench 108 may serve to contain the subsequent growth of the S/D regions 106 and 107, as discussed above. In an embodiment, the trench 108 may have a depth between 20 nanometers and 40 nanometers. In some other embodiments, the sacrificial portions 272 of the fin 244 may be removed so that the top surface of the substrate 102 is above or planar with the top surface of the STI material 105.

FIG. 6 illustrates an assembly 208 subsequent to forming the S/D regions 106 and 107 on the regions 274 of the assembly 206 (FIG. 5). In some embodiments, the S/D regions 106 and 107 may be formed using conventional epitaxial deposition methods, such as low-pressure CVD, vapor phase epitaxy, or molecular beam epitaxy. In some embodiments, the S/D regions 106 and 107 may be formed in the trench 108. The S/D regions 106 and 107 may electrically couple with the portion of the fin 244 under the sacrificial gate 266, and may rise above the top surface of the STI material 105. The S/D regions 106 and 107 may be formed from any appropriate material, such as any of the materials discussed above.

As discussed above, the lattice constant mismatch between the S/D regions 106 and 107 and the top surface of the substrate 102 may create lattice stress. The stress may take any of the forms disclosed herein. In some embodiments, the S/D regions 106 and 107 may be grown from a crystalline surface of a substrate 102 below the fin 244. In the case that the removed outer portions of the fin 244 are heterogeneous (e.g., with alternating nanowire-forming semiconductor material 160 and intervening sacrificial material 170 of differing composition), replacement of these heterogeneous layers with S/D regions 106 and 107 through epitaxial growth may generate a new lattice mismatch on either side of the etched fin 244. The S/D regions 106 and 107, then, may further enhance the uniaxial stress already present in the nanowire-forming semiconductor material 160. Furthermore, upon subsequent removal of the intervening sacrificial material 170 (as discussed below), the S/D regions 106 and 107 act to anchor the then formed discrete nanowires 110. Since, the S/D regions 106 and 107 may be epitaxially grown from the underlying substrate 102, the anchoring may be effective for maintaining the initial uniaxial stress formed along the nanowire-forming semiconductor material 160 during patterning of the fin 244. As such, the S/D regions 106 and 107 both maintain and enhance the uniaxial stress of the ultimately formed nanowires 110. It is noted that the above substitution of heterogeneous layers with a homogeneous layer may be performed by using the same material as the nanowire-forming semiconductor material 160. However, in another embodiment, to further enhance the uniaxial stress, a material different from any of the materials used in the heterogeneous stack of layers (e.g., different from the materials 160 and 170) may be epitaxially grown to form the S/D regions 106 and 107. For example, in one embodiment, the epitaxial S/D regions 106 and 107 are formed from a material having a lattice constant greater than any of the materials in the heterogeneous fin 244. In that embodiment, a uniaxial compressive stress is further enhanced in the ultimately formed nanowires 110. In another embodiment, the epitaxial S/D regions 106 and 107 are formed from a material having a lattice constant less than any of the materials in the heterogeneous fin 244. In that embodiment, a uniaxial tensile stress is further enhanced in the ultimately formed nanowires 110.

In an embodiment, the top surface of the regions 274 of the substrate 102 is a single-crystalline material having a <100>-orientation that serves as a seed layer for epitaxial growth of the S/D regions 106 and 107. The S/D regions 106 and 107 may thus grow in a <100>-orientation. The <111> plane corresponding to the sidewalls 126 and 128 may grow at a more favorable rate during the formation of the S/D regions 106 and 107 and may result in the S/D regions 106 and 107 being <111>-faceted.

In alternative embodiments, the sacrificial portions 272 of the fin 244 are not etched away, but are maintained to form S/D regions for the IC structure 100. Instead of removing the sacrificial portions 272, the sacrificial portions 272 of the fin 244 may be doped by any suitable techniques (e.g., ion implantation) to form S/D regions 106 and 107 of a desired conductivity type and concentration level. Additionally, an epitaxial semiconductor film may be grown on the top and sidewalls of the regions 274 of the fin 244 to form raised S/D regions 106 and 107 to decrease current crowding, if desired (not shown).

FIG. 7 illustrates an assembly 210 subsequent to depositing, and then polishing back, an insulating material 101 on the assembly 208 (FIG. 6). The insulating material 101 may be an interlayer dielectric (ILD), and may be blanket-deposited over all structures, including the S/D regions 106 and 107 and the sacrificial gate 266, using any suitable method (e.g., a CVD method, such as plasma enhanced chemical vapor deposition (PECVD) or low-pressure chemical vapor deposition (LPCVD)). A CMP method may be performed to polish back the blanket-deposited insulating material 101 to expose the top of the sacrificial gate 266.

Figure 8A:
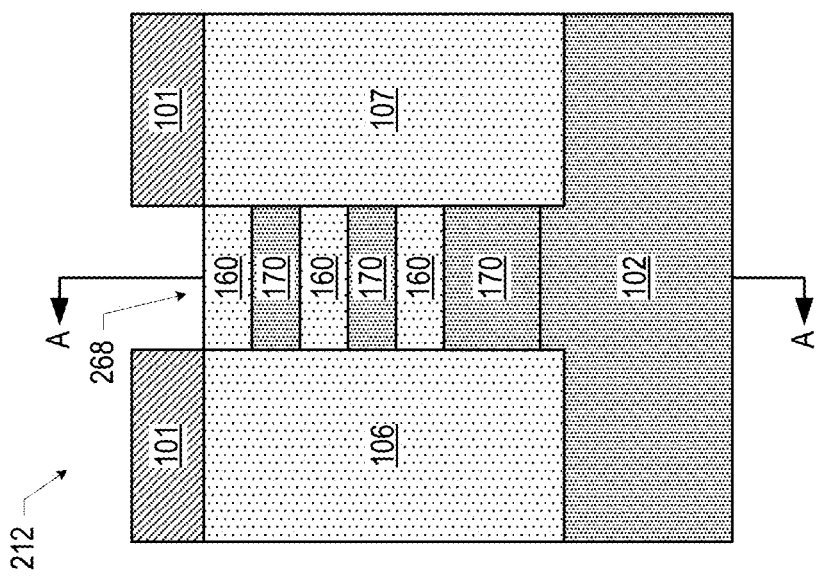

FIG. 8 illustrates an assembly 212 subsequent to removing the sacrificial gate 266 of the assembly 210 (FIG. 7) to expose regions 268 of the fin 244. The insulating material 101 may protect the S/D regions 106 and 107 during the removal of the sacrificial gate 266. The sacrificial gate 266 may be removed using a conventional etching method, such as plasma dry etch or a wet etch. In an embodiment in which the sacrificial gate 266 includes polysilicon and the insulating material 101 includes silicon oxide, a wet etchant such as a TMAH solution may be used to selectively remove the sacrificial gate 266. The sacrificial gate dielectric 262 may serve as an etch stop during the removal of the sacrificial gate electrode material 264, and may be removed using any suitable etching method to expose the regions 268 of the fin 244. In an embodiment in which the sacrificial gate dielectric 262 includes silicon oxide, a dilute HF wet etch may be used to remove the sacrificial gate dielectric 262.

FIG. 9 illustrates an assembly 214 subsequent to removing portions of the layers of sacrificial material 170 between the layers of semiconductor material 160 in the fin 244 under the exposed regions 268 of the assembly 212 (FIG. 8) to form nanowires 110. The portions of the layers of sacrificial material 170 may be removed using any suitable etchant that is selective to the layers of semiconductor material 160 (e.g., the etchant etches the layers of sacrificial material 170 at a significantly higher rate than the layers of semiconductor material 160). In an embodiment, the etchant selectively etches the layers of semiconductor material 160 while not etching the layers of sacrificial material 170. In an embodiment in which the layers of semiconductor material 160 are germanium and the layers of sacrificial material 170 are silicon germanium, the layers of sacrificial material 170 may be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. In an embodiment in which the layers of semiconductor material 160 are silicon and the layers of sacrificial material 170 are silicon germanium, the layers of sacrificial material 170 may be selectively removed using a wet etchant such as, but not limited to, aqueous carboxylic acid/nitric acid/HF solution and aqueous citric acid/nitric acid/HF solution. The removal of the layers of sacrificial material 170 may leave voids 282 between the nanowires 110. The voids 282 between the nanowires 110 may have a thickness between 5 nanometers and 30 nanometers. The remaining layers of semiconductor material 160 form a vertical array of nanowires 110 that are coupled to the S/D regions 106 and 107. The nanowires 110 may take any of the forms disclosed herein. In some embodiments, a timed etch may be utilized to control the removal of the sacrificial material 170.

FIG. 10 illustrates an assembly 216 subsequent to providing a bottom gate isolation material 114 on the top surface of the substrate 102 under the bottom-most nanowire 115 of the assembly 214 (FIG. 9). The bottom gate isolation material 114 may be formed by first blanket-depositing the bottom gate isolation material 114 around and over the nanowires 110, filling the voids 282 between the nanowires 110 (including the void 282 between the bottom-most nanowire 115 and the top surface of the substrate 102) and covering the top surface of the insulating material 101. In some embodiments, the bottom gate isolation material 114 may be deposited using a highly conformal deposition method, such as LPCVD, ALD, or a spin-on dielectric process to improve the likelihood that the voids 282 between the nanowires 110 are completely filled. The bottom gate isolation material 114 may then be recessed from the top downward using any suitable isotropic dielectric etching method. For example, in embodiments in which the bottom gate isolation material 114 is formed of silicon oxide, a timed HF wet etch method may be used to recess the bottom gate isolation material 114. Generally, the bottom gate isolation material 114 may include any suitable dielectric material such as, but not limited to, silicon oxide, silicon nitride, and silicon oxynitride. During the recess of the bottom gate isolation material 114, the majority of the bottom gate isolation material 114 may be removed, leaving behind a thin layer on the top surface of the substrate 102 and under the bottom-most nanowire 115.

Figure 11A:
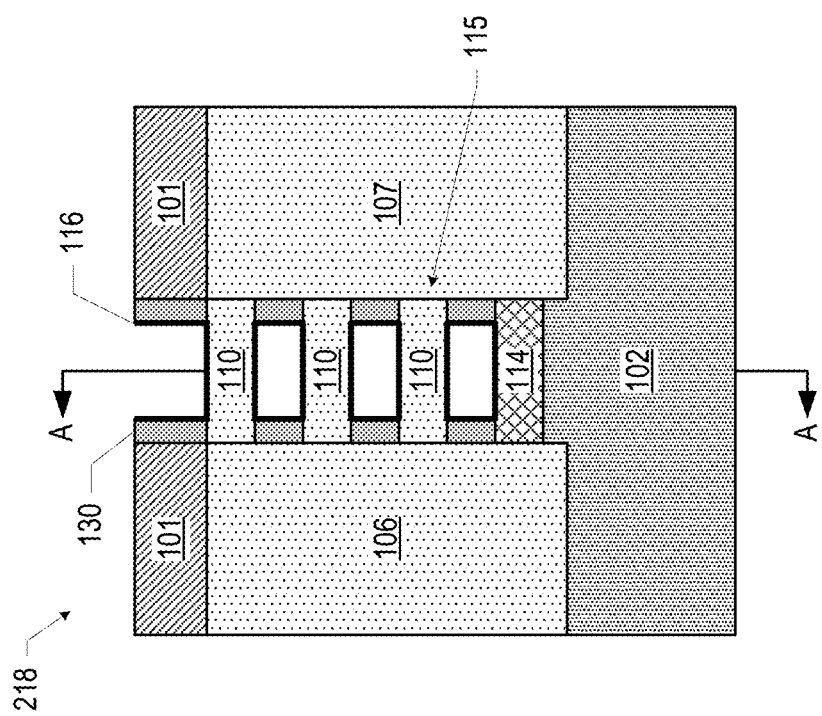

FIG. 11 illustrates an assembly 218 subsequent to providing spacers 130 on the assembly 216 (FIG. 10) and providing a gate dielectric 116 around each nanowire 110 (and along the spacers 130). The gate dielectric 116 may be formed using a highly conformal deposition process (e.g., ALD) in order to ensure the formation of a gate dielectric layer having a uniform thickness around each nanowire 110. In a particular embodiment, the gate dielectric 116 may include hafnium and oxygen (e.g., in the form of hafnium oxide) and may be deposited to a thickness between 1 nanometer and 6 nanometers. The gate dielectric 116 may be present on the top surface of the insulating material 101 (although not shown in FIG. 11). The pair of sidewall spacers 130 may be formed using conventional methods of forming selective spacers, as known in the art. In some embodiments, a conformal dielectric spacer layer, such as, but not limited to, silicon oxide, silicon nitride, silicon oxynitride, and combinations thereof, is first blanket-deposited on all structures, including the fin 244. The dielectric spacer layer may be deposited in a conformal manner so that it has substantially equal thicknesses on both vertical surfaces (such as the sidewalls 242 and 246) and horizontal surfaces. The dielectric spacer layer may be deposited using a CVD method such as LPCVD and PECVD, for example.

In some embodiments, the dielectric spacer layer may be deposited to a thickness between 2 nanometers and 10 nanometers. Next, an unpatterned anisotropic etch may be performed on the dielectric spacer layer using conventional anisotropic etch methods, such as reactive ion etching (RIE). During the anisotropic etching process, most of the dielectric spacer layer may be removed from horizontal surfaces, leaving the dielectric spacer layer on the vertical surfaces, as shown. Next, an unpatterned isotropic etch may be performed to remove the remaining dielectric spacer layer from any horizontal surfaces, leaving pairs of spacers 130; upon formation of the gate electrode 113 (as discussed below), the gate electrode 113 may be "bookended" by a pair of spacers 130. In some embodiments, the isotropic etch is a wet etch process. In a specific embodiment, where the dielectric spacer layer is silicon nitride or silicon oxide, the isotropic etch may employ a wet etchant solution comprising phosphoric acid or a buffered oxide etch (BOE), respectively. In an alternate embodiment, the isotropic etch may be a dry etch process. In one such embodiment, nitrogen trifluoride ($NF_3$) gas may be employed in a downstream plasma reactor to isotropically etch the dielectric spacer layers. Although the spacers 130 are depicted as having substantially rectangular cross-sections, this is for ease of illustration; in some embodiments, the spacers 130 may be thinner farther from the substrate 102 and thicker closer to the substrate 102. In some embodiments, the spacers 130 may have a convex shape.

Figure 12A:
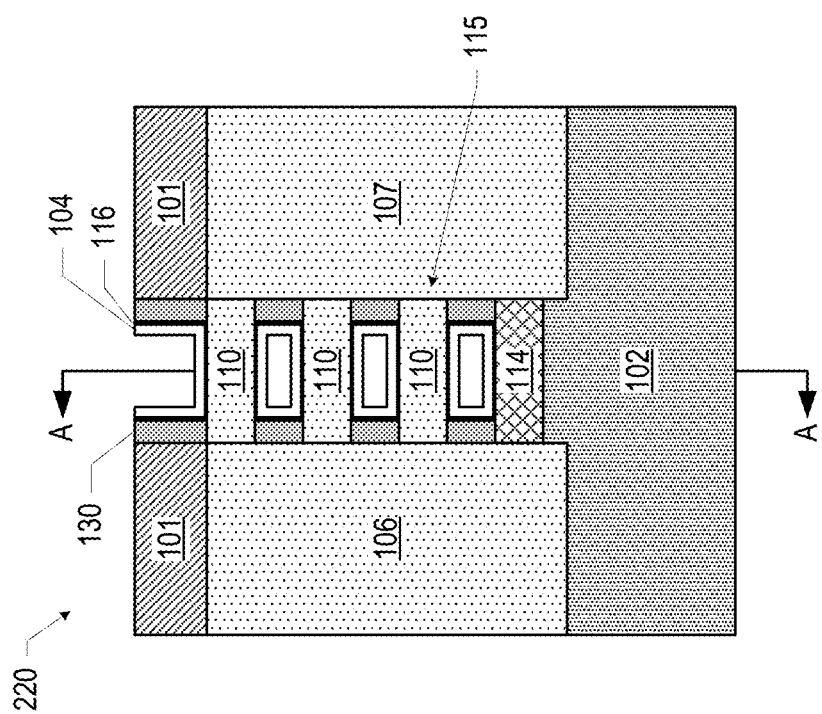

FIG. 12 illustrates an assembly 220 subsequent to providing a conformal layer of a first liner material 104 on the assembly 218 (FIG. 11). The first liner material 104 may take any of the forms discussed herein. In particular, in some embodiments, the first liner material 104 may include titanium and nitrogen (e.g., in the form of titanium nitride) and may be deposited by ALD to a thickness less than 5 Angstroms. The first liner material 104 may also be present on the top surface of the insulating material 101 (although not shown in FIG. 12).

Figure 13A:
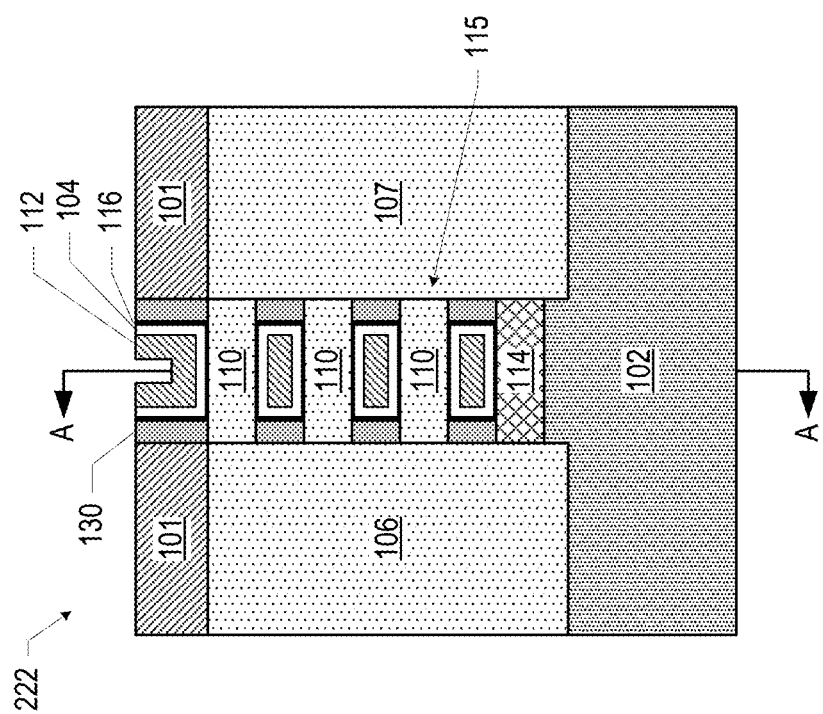

FIG. 13 illustrates an assembly 222 subsequent to providing a conformal layer of a second liner material 112 on the assembly 220 (FIG. 12). The second liner material 112 may take any of the forms discussed herein. In particular, in some embodiments, the second liner material 112 may include tungsten and may be deposited by a chlorine-based ALD process to a thickness between 15 Angstroms and 50 Angstroms. Such a second liner material 112 may be referred to as fluorine-free tungsten (FFW) due to its deposition using a chlorine-based chemistry (and not a fluorine-based chemistry), although some fluorine may be present. The second liner material 112 may also be present on the top surface of the insulating material 101 (although not shown in FIG. 13).

Figure 14A:
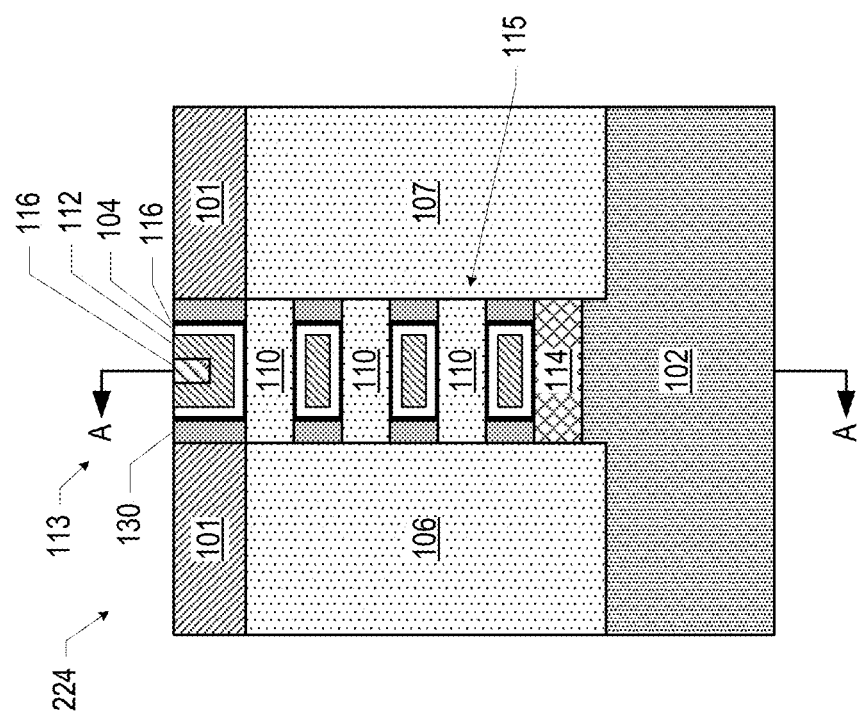

FIG. 14 illustrates an assembly 224 subsequent to providing a fill material 118 on the assembly 222 (FIG. 13). The fill material 118 may take any of the forms disclosed herein. In particular, in some embodiments, the fill material 118 may include tungsten or molybdenum deposited using a CVD technique. The fill material 118 may adhere to and nucleate on the second liner material 112 (e.g., resulting in the small grain sizes for tungsten of the fill material 118, as discussed above). In some embodiments, the fill material 118 may be initially deposited so as to extend over the insulating material 101; a CMP technique may be performed to remove any fill material 118, second liner material 112, first liner material 104, and/or gate dielectric 116 above the insulating material 101. The assembly 224 may take the form of the IC structure 100 discussed above with reference to FIG. 1.

Figure 15A:
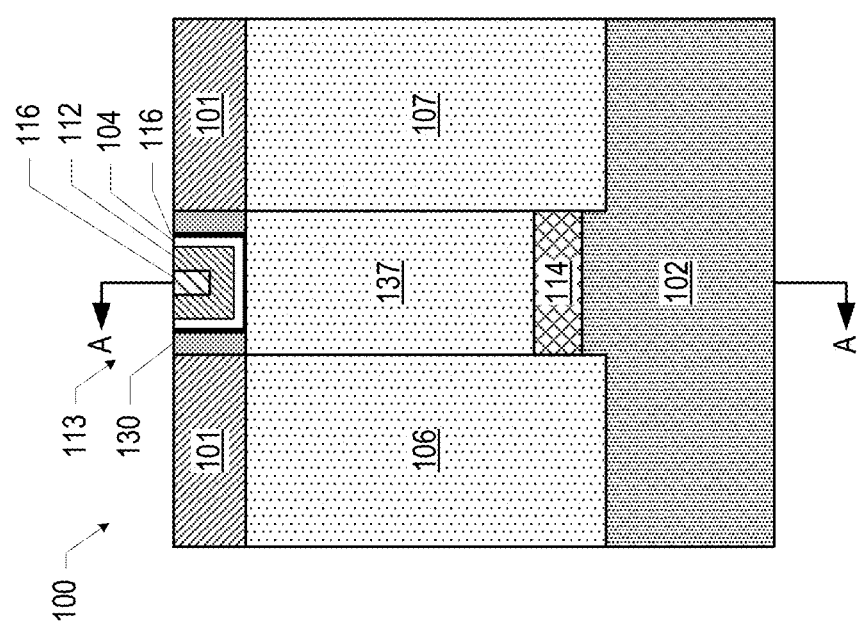

In some embodiments, the gate electrodes 113 discussed above with reference to the nanowire-based IC structures 100 of FIGS. 1-14 may be utilized with fin-based IC structures 100. For example, FIGS. 15A-15D are views of a fin-based IC structure 100, in accordance with various embodiments. FIG. 15A is a side cross-sectional view of the IC structure 100 along the longitudinal axis of the fin 137, FIG. 15B is a cross-sectional view taken through the section A-A of FIG. 1A (through the gate electrode 113), FIG. 15C is a side view taken toward the S/D region 106, and FIG. 15D is a top view. Although only a single IC structure 100 is depicted in FIG. 15, this is simply for ease of illustration, and an electrical device may include any number of the IC structures 100 (e.g., in an array or any other desired arrangement) of FIG. 15. The IC structure 100 of FIG. 15 may be a fin-based transistor.

The IC structure 100 of FIG. 15 may share a number of features with the IC structure 100 of FIG. 1, and any of those features may take any of the forms discussed herein. In contrast to the IC structure 100 of FIG. 1, the IC structure 100 of FIG. 15 includes a fin 137 that may provide the channel of a transistor, rather than one or more nanowires 110. The fin 137 may include any of the materials discussed herein with reference to the nanowires 110, and the IC structure 100 of FIG. 15 may be manufactured using a process similar to that of FIGS. 2-14, appropriately modifying the operations related to the formation of the nanowires 110. In particular, the IC structure 100 of FIG. 15 may include a gate electrode 113 that includes a first liner material 104, a second liner material 112, and a fill material 118 as disclosed herein.

The use of the gate electrodes 113 disclosed herein in fin-based IC structures 100 (like that of FIG. 15) may permit the gate electrode 113 to be recessed below the top surface of the spacers 130. In some embodiments, such recessing may be desirable in order to mitigate the risk of inadvertent shorts between the gate and the S/D regions 106/107, for example. FIG. 16 is a side, cross-sectional view of a fin-based IC structure 100, sharing the perspective of FIG. 15A, in which the gate electrode 113 (and optionally the gate dielectric 116) is recessed so that the top surface of the gate electrode 113 is below the top surface of the spacers 130. In conventional IC structures, the recessing of a gate electrode may not be achievable due to the voids (e.g., open spaces) in the material of the gate electrode; recessing, and therefore thinning, the top portion of the gate electrode may result in a break in the electrical connectivity of the gate. The use of the techniques and structures for the gate electrode 113 disclosed herein, however, may enable recessing of the gate electrode 113 with lower or minimal risk of electrical disconnection. Recessed gate electrodes 113 may also be used with nanowire-based IC structures 100 (e.g., the nanowire-based IC structures 100 discussed above with reference to FIG. 1). In some embodiments, the gate electrodes 113 disclosed herein may permit recessing when the gate length 120 is less than or equal to 20 nanometers, a feature not reliably achievable using conventional techniques.

The IC structures 100 disclosed herein may be included in any suitable electronic component. FIGS. 17-21 illustrate various examples of apparatuses that may include any of the IC structures 100 disclosed herein.

FIG. 17 is a top view of a wafer 1500 and dies 1502 that may include one or more IC structures 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., in a device layer 1604, as discussed below with reference to FIG. 18), one or more transistors (e.g., some of the transistors 1640 of FIG. 18, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 21) or other logic that is configured to store information in the memory devices or execute instructions stored in the memory array.

FIG. 18 is a side, cross-sectional view of an IC device 1600 that may include one or more IC structures 100 in accordance with any of the embodiments disclosed herein. One or more of the IC devices 1600 may be included in one or more dies 1502 (FIG. 17). The IC device 1600 may be formed on a substrate 1602 (e.g., the wafer 1500 of FIG. 17) and may be included in a die (e.g., the die 1502 of FIG. 17). The substrate 1602 may be a semiconductor substrate composed of semiconductor material systems including, for example, n-type or p-type materials systems (or a combination of both). The substrate 1602 may include, for example, a crystalline substrate formed using a bulk silicon or a SOI substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 17) or a wafer (e.g., the wafer 1500 of FIG. 17).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 18 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors. For example, the transistors 1640 may include any of the IC structures 100 disclosed herein.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Any of these embodiments of the gate dielectric may serve as the gate dielectric 116 of an IC structure 100.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, tungsten (e.g., in accordance with any of the embodiments disclosed herein), ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures.

For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride, and may be formed as discussed above. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

In some embodiments, the device layer 1604 may include one or more IC structures 100 (e.g., as some or all of the transistors 1640). An IC structure 100 included in a device layer 1604 may be referred to as a "front-end" structure. One or more IC structures 100 in the device layer 1604 may be coupled to any suitable other ones of the devices in the device layer 1604, to any devices or conductive pathways in the metallization stack 1619 (discussed below), and/or to one or more of the conductive contacts 1636 (discussed below).

Electrical signals, such as power and/or input/output (I/O) signals, may be routed to and/or from the devices (e.g., the transistors 1640, such as the IC structures 100) of the device layer 1604 through one or more interconnect layers disposed on the device layer 1604 (illustrated in FIG. 18 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more IC structures 100 may be disposed in one or more of the interconnect layers 1606-1610. An IC structure 100 included in the metallization stack 1619 may be referred to as a "back-end" structure. One or more IC structures 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 18). Although a particular number of interconnect layers 1606-1610 is depicted in FIG. 18, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 18. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 18. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 18, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 19:
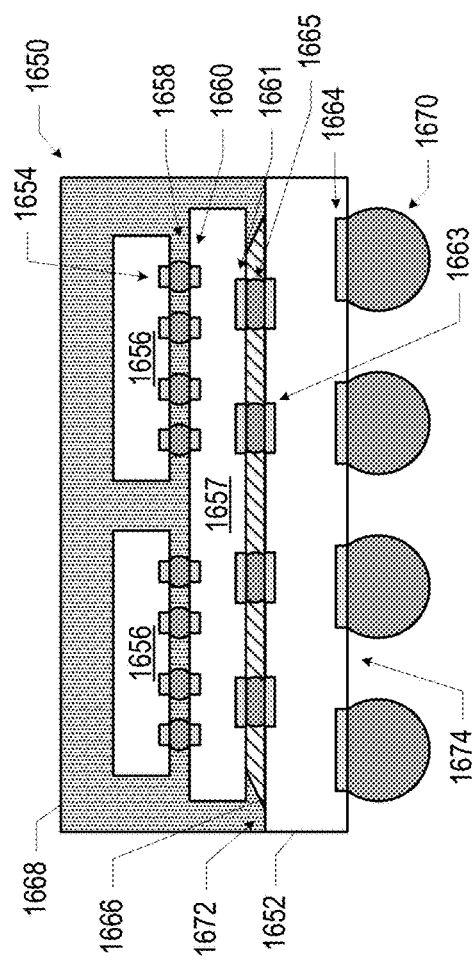
FIG. 19 is a side, cross-sectional view of an IC package that may include an IC structure, in accordance with various embodiments.

FIG. 19 is a side, cross-sectional view of an example IC package 1650 that may include one or more IC structures 100 (e.g., in a die 1656). In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 18.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 or to other devices included in the package substrate 1652, not shown.

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 19 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 19 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 19 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 20.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, the die 1656 may include one or more IC structures 100 (e.g., as discussed above with reference to FIG. 17 and FIG. 18).

Although the IC package 1650 illustrated in FIG. 19 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 19, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 20:
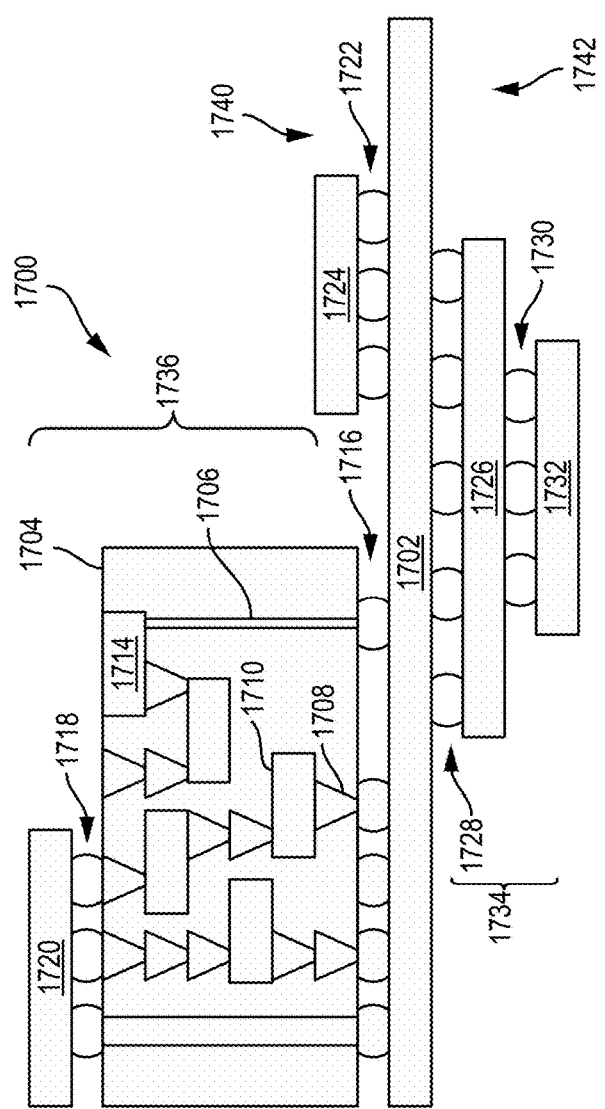
FIG. 20 is a side, cross-sectional view of an IC device assembly that may include an IC structure, in accordance with any of the embodiments disclosed herein.

FIG. 20 is a side, cross-sectional view of an IC device assembly 1700 that may include one or more IC packages or other electronic components (e.g., a die) including one or more IC structures 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 19 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 20 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 20), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 20, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 17), an IC device (e.g., the IC device 1600 of FIG. 18), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 20, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 20 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 21:
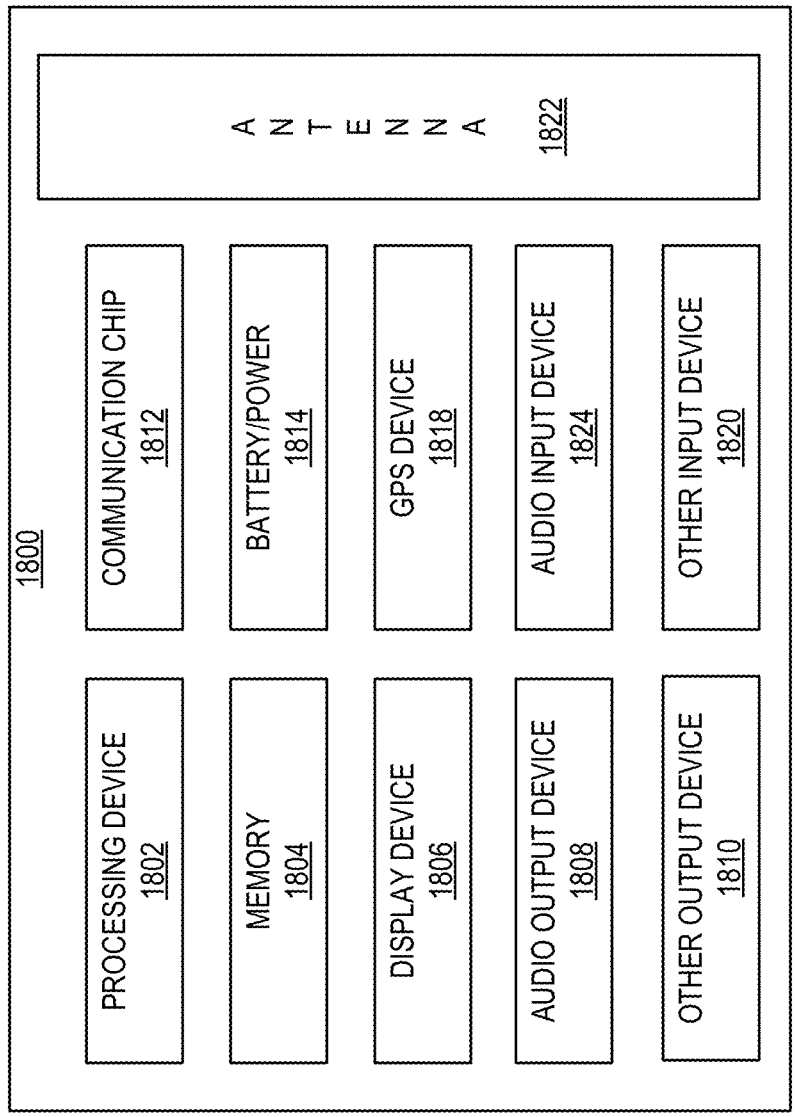
FIG. 21 is a block diagram of an example electrical device that may include an IC structure, in accordance with any of the embodiments disclosed herein.

FIG. 21 is a block diagram of an example electrical device 1800 that may include one or more IC structures 100, in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 21 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 21, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a first nanowire in a metal region; and a second nanowire in the metal region; wherein a distance between the first nanowire and the second nanowire is less than 5 nanometers, and the metal region includes tungsten between the first nanowire and the second nanowire.

Example 2 includes the subject matter of Example 1, and further specifies that the metal region includes a first portion between the first nanowire and the second nanowire, the metal region includes a second portion not between the first nanowire and the second nanowire, and a ratio of chlorine to fluorine in the first portion is less than a ratio of chlorine to fluorine in the second portion.

Example 3 includes the subject matter of any of Examples 1-2, and further specifies that an average grain size of the tungsten in a portion of the metal region is less than 8 nanometers.

Example 4 includes the subject matter of any of Examples 1-3, and further specifies that an average grain size of the tungsten in a portion of the metal region is less than 6 nanometers.

Example 5 includes the subject matter of any of Examples 1-4, and further specifies that the first nanowire includes silicon or germanium.

Example 6 includes the subject matter of any of Examples 1-5, and further includes: a first portion of high-k material around the first nanowire in the metal region; and a second portion of high-k material around the second nanowire in the metal region. Example of Examples 6, and further specifies that the high-k material includes hafnium.

Example 8 includes the subject matter of any of Examples 1-7, and further specifies that the first nanowire has a thickness between 4 nanometers and 10 nanometers.

Example 9 includes the subject matter of any of Examples 1-8, and further specifies that the first nanowire has a width between 5 nanometers and 50 nanometers.

Example 10 includes the subject matter of any of Examples 1-9, and further specifies that the first nanowire, the second nanowire, and the metal region are part of a gate-all-around transistor.

Example 11 is an integrated circuit (IC) structure, including: a first nanowire in a metal region; and a second nanowire in the metal region, wherein the metal region includes a first portion between the first nanowire and the second nanowire, and the metal region includes a second portion not between the first nanowire and the second nanowire; wherein a ratio of chlorine to fluorine in the first portion is less than a ratio of chlorine to fluorine in the second portion.

Example 12 includes the subject matter of Example 11, and further specifies that the metal region includes tungsten.

Example 13 includes the subject matter of Example 12, and further specifies that an average grain size of the tungsten in a portion of the metal region is less than 8 nanometers.

Example 14 includes the subject matter of Example 13, and further specifies that the average grain size of the tungsten in the portion of the metal region is less than 6 nanometers.

Example 15 includes the subject matter of any of Examples 11-14, and further specifies that the first nanowire includes silicon or germanium.

Example 16 includes the subject matter of any of Examples 11-15, and further includes: a first portion of high-k material around the first nanowire in the metal region; and a second portion of high-k material around the second nanowire in the metal region.

Example 17 includes the subject matter of Example 16, and further specifies that the high-k material includes hafnium.

Example 18 includes the subject matter of any of Examples 11-17, and further specifies that the first nanowire has a thickness between 4 nanometers and 10 nanometers.

Example 19 includes the subject matter of any of Examples 11-18, and further specifies that the first nanowire has a width between 5 nanometers and 50 nanometers.

Example 20 includes the subject matter of any of Examples 11-19, and further specifies that the first nanowire, the second nanowire, and the metal region are part of a gate-all-around transistor.

Example 21 includes the subject matter of any of Examples 11-20, and further specifies that the metal region includes molybdenum.

Example 22 is an integrated circuit (IC) structure, including: a first nanowire in a metal region; and a second nanowire in the metal region, wherein the metal region includes tungsten and an average grain size of the tungsten in a portion of the metal region is less than 8 nanometers.

Example 23 includes the subject matter of Example 22, and further specifies that the average grain size of the tungsten in the portion of the metal region is less than 6 nanometers.

Example 24 includes the subject matter of any of Examples 22-23, and further specifies that the first nanowire includes silicon or germanium.

Example 25 includes the subject matter of any of Examples 22-24, and further includes: a first portion of high-k material around the first nanowire in the metal region; and a second portion of high-k material around the second nanowire in the metal region.

Example 26 includes the subject matter of Example 25, and further specifies that the high-k material includes hafnium.

Example 27 includes the subject matter of any of Examples 22-26, and further specifies that the first nanowire has a thickness between 4 nanometers and 10 nanometers.

Example 28 includes the subject matter of any of Examples 22-27, and further specifies that the first nanowire has a width between 5 nanometers and 50 nanometers.

Example 29 includes the subject matter of any of Examples 22-28, and further specifies that the first nanowire, the second nanowire, and the metal region are part of a gate-all-around transistor.

Example 30 is an integrated circuit (IC) structure, including: a gate including a gate metal; and dielectric spacers at sides of the gate, wherein a top surface of the gate metal is below a top surface of the dielectric spacers, the gate metal includes tungsten, and a width of the gate is less than 20 nanometers.

Example 31 includes the subject matter of Example 30, and further specifies that an average grain size of the tungsten in a region of the gate metal is less than 8 nanometers.

Example 32 includes the subject matter of any of Examples 30-31, and further specifies that an average grain size of the tungsten in a region of the gate metal is less than 6 nanometers.

Example 33 includes the subject matter of any of Examples 30-32, and further includes: a fin, wherein the gate is disposed at least partially around the fin.

Example 34 includes the subject matter of Example 33, and further specifies that the fin includes silicon or germanium.

Example 35 includes the subject matter of any of Examples 30-34, and further specifies that the gate includes a high-k material between the gate metal and the dielectric spacers.

Example 36 includes the subject matter of Example 35, and further specifies that the high-k material includes hafnium.

Example 37 is an integrated circuit (IC) package, including: a die including the IC structure of any of Examples 1-36; and a package substrate coupled to the die.

Example 38 includes the subject matter of Example 37, and further specifies that the IC structure is included in a device layer of the die, and the die further includes a metallization stack.

Example 39 includes the subject matter of any of Examples 37-38, and further specifies that the die is coupled to the package substrate by solder.

Example 40 is a computing device, including: an integrated circuit (IC) package in accordance with any of Examples 37-39; and a circuit board coupled to the IC package.

Example 41 includes the subject matter of Example 40, and further specifies that the circuit board is a motherboard.

Example 42 includes the subject matter of any of Examples 40-41, and further specifies that the computing device is a handheld computing device.

Example 43 includes the subject matter of any of Examples 40-41, and further specifies that the computing device is a laptop computing device.

Example 44 includes the subject matter of any of Examples 40-41, and further specifies that the computing device is a server computing device.

Example 45 includes the subject matter of any of Examples 40-44, and further includes: an antenna coupled to the circuit board.

Example 46 includes the subject matter of any of Examples 40-45, and further includes: a display coupled to the circuit board.

Example 47 is a method of fabricating a PMOS transistor, including: forming a channel region;
performing a chlorine-based atomic layer deposition (ALD) process to deposit tungsten on the channel region; and performing a tungsten fill operation on the deposited tungsten.

Example 48 includes the subject matter of Example 47, and further specifies that the channel region includes one or more nanowires.

The invention claimed is:

1. An integrated circuit (IC) structure, comprising:
a first nanowire in a metal region; and
a second nanowire in the metal region;
wherein a distance between the first nanowire and the second nanowire is less than 5 nanometers, the metal region includes tungsten between the first nanowire and the second nanowire, the metal region includes a first portion between the first nanowire and the second nanowire, the metal region includes a second portion not between the first nanowire and the second nanowire, and a ratio of chlorine to fluorine in the first portion is less than a ratio of chlorine to fluorine in the second portion.

2. The IC structure of claim 1, wherein an average grain size of the tungsten in a portion of the metal region is less than 8 nanometers.

3. The IC structure of claim 1, wherein an average grain size of the tungsten in a portion of the metal region is less than 6 nanometers.

4. The IC structure of claim 1, wherein the first nanowire includes silicon or germanium.

5. The IC structure of claim 1, wherein the first nanowire has a thickness between 4 nanometers and 10 nanometers.

6. The IC structure of claim 1, wherein the first nanowire has a width between 5 nanometers and 50 nanometers.

7. The IC structure of claim 1, wherein the first nanowire, the second nanowire, and the metal region are part of a gate-all-around transistor.

8. The IC structure of claim 1, wherein the metal region includes molybdenum.

9. An integrated circuit (IC) structure, comprising:
a first nanowire in a metal region; and
a second nanowire in the metal region, wherein the metal region includes a first portion between the first nanowire and the second nanowire, and the metal region includes a second portion not between the first nanowire and the second nanowire;
wherein a ratio of chlorine to fluorine in the first portion is less than a ratio of chlorine to fluorine in the second portion.

10. The IC structure of claim 9, wherein the metal region includes tungsten.

11. The IC structure of claim 9, wherein the first nanowire includes silicon or germanium.

12. The IC structure of claim 9, further comprising:
a first portion of high-k material around the first nanowire in the metal region; and
a second portion of high-k material around the second nanowire in the metal region.

13. The IC structure of claim 12, wherein the high-k material includes hafnium.

14. The IC structure of claim 9, wherein the first nanowire, the second nanowire, and the metal region are part of a gate-all-around transistor.

15. The IC structure of claim 9, wherein the metal region includes molybdenum.

16. An integrated circuit (IC) structure, comprising:
a first nanowire in a metal region; and
a second nanowire in the metal region
wherein the metal region includes tungsten, an average grain size of the tungsten in a portion of the metal region is less than 8 nanometers, the metal region includes a first portion between the first nanowire and the second nanowire, and the metal region includes a second portion not between the first nanowire and the second nanowire, and a ratio of chlorine to fluorine in the first portion is less than a ratio of chlorine to fluorine in the second portion.

17. The IC structure of claim 16, wherein the average grain size of the tungsten in the portion of the metal region is less than 6 nanometers.

18. The IC structure of claim 16, wherein the first nanowire includes silicon or germanium.

19. The IC structure of claim 16, wherein the first nanowire has a thickness between 4 nanometers and 10 nanometers.

20. The IC structure of claim 16, wherein the first nanowire, the second nanowire, and the metal region are part of a gate-all-around transistor.

* * * * *